(12) United States Patent
Lung et al.

(10) Patent No.: US 8,395,935 B2
(45) Date of Patent: Mar. 12, 2013

(54) CROSS-POINT SELF-ALIGNED REDUCED CELL SIZE PHASE CHANGE MEMORY

(75) Inventors: Hsiang-Lan Lung, Dobbs Ferry, NY (US); Erh-Kun Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 220 days.

(21) Appl. No.: 12/899,232

(22) Filed: Oct. 6, 2010

(65) Prior Publication Data
US 2012/0087181 A1 Apr. 12, 2012

(51) Int. Cl.
G11C 11/00 (2006.01)

(52) U.S. Cl. ............ 365/163; 365/46; 365/55; 365/74; 365/97; 365/131; 365/148; 365/158; 365/171; 365/173; 257/E21.004; 438/128

(58) Field of Classification Search ............... 365/46, 365/55, 74, 97, 100, 131, 148, 158, 171, 365/173, 163; 257/E21.004; 438/128
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,676,220 A | 6/1987 | Pietraszek | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi | |
| 5,391,901 A | 2/1995 | Tanabe | |
| 5,515,488 A | 5/1996 | Hoppe et al. | |
| 5,534,712 A | 7/1996 | Ovshinsky et al. | |
| 5,550,396 A | 8/1996 | Tsutsumi | |

(Continued)

FOREIGN PATENT DOCUMENTS
WO 0079539 A1 12/2000
WO 0145108 A1 6/2001

(Continued)

OTHER PUBLICATIONS

"Magnetic Bit Boost," www.sciencenews.org, Dec. 18 & 25, 2004, p. 389, vol. 166.

(Continued)

Primary Examiner — Fernando Hidalgo
(74) Attorney, Agent, or Firm — Haynes Beffel & Wolfeld LLP

(57) ABSTRACT

A programmable memory array is disclosed in which the phase change memory cells are self-aligned at the access devices and at the cross-points of the bit lines and the word lines. A method for making the array employs one line mask to define the bit lines and another line mask to define the word lines. The front end of line (FEOL) memory cell elements are in the same layer as the polysilicon gates. The bit lines and the word lines intersect over the devices, and the memory cell elements are formed at the intersections of the bit lines and the word line.

6 Claims, 32 Drawing Sheets

U.S. PATENT DOCUMENTS

| | | | |
|---|---|---|---|
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,031,267 A | 2/2000 | Lien |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,214,958 B1 | 4/2001 | Le-Khac et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,687,307 B1 | 2/2004 | Anikhindi et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,750,101 B2 | 6/2004 | Lung |
| 6,789,277 B2 | 9/2004 | Spitzer |
| 6,791,102 B2 | 9/2004 | Johnson et al. |
| 6,791,859 B2 | 9/2004 | Hush et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,808,991 B1 | 10/2004 | Tung |
| 6,815,704 B1 | 11/2004 | Chen |
| 6,830,952 B2 | 12/2004 | Lung |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Chen |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kim et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |

| | | | | | | |
|---|---|---|---|---|---|---|
| 7,132,675 B2 | 11/2006 | Gilton | | 2004/0256610 A1 | 12/2004 | Lung |
| 7,151,273 B2 | 12/2006 | Campbell et al. | | 2005/0018526 A1 | 1/2005 | Lee |
| 7,154,774 B2 | 12/2006 | Bedeschi et al. | | 2005/0029267 A1 | 2/2005 | Martin et al. |
| 7,158,411 B2 | 1/2007 | Yeh et al. | | 2005/0029502 A1 | 2/2005 | Hudgens |
| 7,164,147 B2 | 1/2007 | Lee et al. | | 2005/0052904 A1 | 3/2005 | Cho et al. |
| 7,166,533 B2 | 1/2007 | Happ | | 2005/0062087 A1 | 3/2005 | Chen et al. |
| 7,169,635 B2 | 1/2007 | Kozicki | | 2005/0093022 A1 | 5/2005 | Lung |
| 7,202,493 B2 | 4/2007 | Lung | | 2005/0127347 A1 | 6/2005 | Choi et al. |
| 7,208,751 B2 | 4/2007 | Ooishi | | 2005/0127349 A1 | 6/2005 | Horak et al. |
| 7,214,958 B2 | 5/2007 | Happ | | 2005/0141261 A1 | 6/2005 | Ahn |
| 7,220,983 B2 | 5/2007 | Lung | | 2005/0145984 A1 | 7/2005 | Chen et al. |
| 7,229,883 B2 | 6/2007 | Wang et al. | | 2005/0167656 A1 | 8/2005 | Sun et al. |
| 7,238,959 B2 | 7/2007 | Chen | | 2005/0191804 A1 | 9/2005 | Lai et al. |
| 7,238,994 B2 | 7/2007 | Chen et al. | | 2005/0195633 A1 | 9/2005 | Choi et al. |
| 7,248,494 B2 | 7/2007 | Oh et al. | | 2005/0201182 A1 | 9/2005 | Osada et al. |
| 7,251,157 B2 | 7/2007 | Osada et al. | | 2005/0212024 A1 | 9/2005 | Happ |
| 7,253,429 B2 | 8/2007 | Klersy et al. | | 2005/0212026 A1 | 9/2005 | Chung et al. |
| 7,254,059 B2 | 8/2007 | Li et al. | | 2005/0215009 A1 | 9/2005 | Cho |
| 7,262,502 B2 | 8/2007 | Chang | | 2005/0263829 A1 | 12/2005 | Song et al. |
| 7,269,052 B2 | 9/2007 | Segal et al. | | 2006/0006472 A1 | 1/2006 | Jiang |
| 7,277,317 B2 | 10/2007 | Le Phan | | 2006/0018156 A1 | 1/2006 | Happ |
| 7,291,556 B2 | 11/2007 | Choi et al. | | 2006/0038221 A1 | 2/2006 | Lee et al. |
| 7,309,630 B2 | 12/2007 | Fan et al. | | 2006/0066156 A1 | 3/2006 | Dong et al. |
| 7,314,776 B2 | 1/2008 | Johnson et al. | | 2006/0073642 A1 | 4/2006 | Yeh et al. |
| 7,317,201 B2 | 1/2008 | Gutsche et al. | | 2006/0091476 A1 | 5/2006 | Pinnow et al. |
| 7,321,130 B2 | 1/2008 | Lung et al. | | 2006/0094154 A1 | 5/2006 | Lung |
| 7,323,708 B2 | 1/2008 | Lee et al. | | 2006/0108667 A1 | 5/2006 | Lung |
| 7,323,734 B2 | 1/2008 | Ha et al. | | 2006/0110878 A1 | 5/2006 | Lung et al. |
| 7,332,370 B2 | 2/2008 | Chang et al. | | 2006/0110888 A1 | 5/2006 | Cho et al. |
| 7,336,526 B2 | 2/2008 | Osada et al. | | 2006/0113520 A1 | 6/2006 | Yamamoto et al. |
| 7,351,648 B2 | 4/2008 | Furukawa et al. | | 2006/0113521 A1 | 6/2006 | Lung |
| 7,359,231 B2 | 4/2008 | Venkataraman et al. | | 2006/0118913 A1 | 6/2006 | Yi et al. |
| 7,364,935 B2 | 4/2008 | Lung | | 2006/0124916 A1 | 6/2006 | Lung |
| 7,365,385 B2 | 4/2008 | Abbott | | 2006/0126395 A1 | 6/2006 | Chen et al. |
| 7,379,328 B2 | 5/2008 | Osada et al. | | 2006/0131555 A1 | 6/2006 | Liu et al. |
| 7,385,235 B2 | 6/2008 | Lung | | 2006/0138467 A1 | 6/2006 | Lung |
| 7,388,273 B2 | 6/2008 | Burr et al. | | 2006/0154185 A1 | 7/2006 | Ho et al. |
| 7,394,088 B2 | 7/2008 | Lung | | 2006/0157680 A1 | 7/2006 | Takaura et al. |
| 7,394,089 B2 | 7/2008 | Doyle et al. | | 2006/0157681 A1 | 7/2006 | Chen et al. |
| 7,397,060 B2 | 7/2008 | Lung | | 2006/0163554 A1 | 7/2006 | Lankhorst et al. |
| 7,400,522 B2 | 7/2008 | Toda et al. | | 2006/0169968 A1 | 8/2006 | Happ |
| 7,423,300 B2 | 9/2008 | Lung et al. | | 2006/0172067 A1 | 8/2006 | Ovshinsky et al. |
| 7,426,134 B2 | 9/2008 | Happ et al. | | 2006/0175599 A1 | 8/2006 | Happ |
| 7,440,308 B2 | 10/2008 | Jeong et al. | | 2006/0192193 A1 | 8/2006 | Lee et al. |
| 7,449,710 B2 | 11/2008 | Lung | | 2006/0198183 A1 | 9/2006 | Kawahara et al. |
| 7,456,421 B2 | 11/2008 | Lung | | 2006/0202245 A1 | 9/2006 | Zuliani et al. |
| 7,473,576 B2 | 1/2009 | Lung | | 2006/0205108 A1 | 9/2006 | Maimon et al. |
| 7,476,587 B2 | 1/2009 | Lung | | 2006/0211165 A1 | 9/2006 | Hwang et al. |
| 7,479,649 B2 | 1/2009 | Lung | | 2006/0226409 A1 | 10/2006 | Burr et al. |
| 7,485,891 B2 | 2/2009 | Hamann et al. | | 2006/0234138 A1 | 10/2006 | Fehlhaber et al. |
| 7,488,968 B2 | 2/2009 | Lee | | 2006/0237756 A1 | 10/2006 | Park et al. |
| 7,502,252 B2 | 3/2009 | Fuji et al. | | 2006/0245236 A1 | 11/2006 | Zaidi |
| 7,507,986 B2 | 3/2009 | Lung | | 2006/0250885 A1 | 11/2006 | Cho et al. |
| 7,514,334 B2 | 4/2009 | Chen et al. | | 2006/0261392 A1 | 11/2006 | Lee et al. |
| 7,514,705 B2 | 4/2009 | Breitwisch et al. | | 2006/0266993 A1 | 11/2006 | Suh et al. |
| 7,515,461 B2 | 4/2009 | Happ et al. | | 2006/0281216 A1 | 12/2006 | Chang et al. |
| 7,560,337 B2 | 7/2009 | Ho et al. | | 2006/0284157 A1 | 12/2006 | Chen et al. |
| 7,569,844 B2 | 8/2009 | Lung | | 2006/0284158 A1 | 12/2006 | Lung et al. |
| 7,683,360 B2 | 3/2010 | Chen et al. | | 2006/0284214 A1 | 12/2006 | Chen |
| 7,688,619 B2 | 3/2010 | Lung et al. | | 2006/0284279 A1 | 12/2006 | Lung et al. |
| 7,696,503 B2 | 4/2010 | Lung et al. | | 2006/0286709 A1 | 12/2006 | Lung et al. |
| 7,701,759 B2 | 4/2010 | Lung et al. | | 2006/0286743 A1 | 12/2006 | Lung et al. |
| 8,194,470 B2 * | 6/2012 | Higashitani ............... 365/185.33 | | 2006/0289847 A1 | 12/2006 | Dodge |
| 8,198,124 B2 * | 6/2012 | Greeley et al. .................. 438/95 | | 2006/0289848 A1 | 12/2006 | Dennison |
| 2002/0017701 A1 | 2/2002 | Klersy et al. | | 2007/0007613 A1 | 1/2007 | Wang et al. |
| 2002/0070457 A1 | 6/2002 | Sun et al. | | 2007/0008786 A1 | 1/2007 | Scheuerlein |
| 2002/0113273 A1 | 8/2002 | Hwang et al. | | 2007/0010054 A1 | 1/2007 | Fan et al. |
| 2002/0168852 A1 | 11/2002 | Harshfield et al. | | 2007/0030721 A1 | 2/2007 | Segal et al. |
| 2002/0182835 A1 | 12/2002 | Quinn | | 2007/0037101 A1 | 2/2007 | Morioka |
| 2003/0072195 A1 | 4/2003 | Mikolajick | | 2007/0040159 A1 | 2/2007 | Wang |
| 2003/0095426 A1 | 5/2003 | Hush et al. | | 2007/0045606 A1 | 3/2007 | Magistretti et al. |
| 2003/0116794 A1 | 6/2003 | Lowrey | | 2007/0051936 A1 | 3/2007 | Pellizzer et al. |
| 2003/0186481 A1 | 10/2003 | Lung | | 2007/0096162 A1 | 5/2007 | Happ et al. |
| 2004/0026686 A1 | 2/2004 | Lung | | 2007/0096248 A1 | 5/2007 | Philipp et al. |
| 2004/0051094 A1 | 3/2004 | Ooishi | | 2007/0108077 A1 | 5/2007 | Lung et al. |
| 2004/0113137 A1 | 6/2004 | Lowrey | | 2007/0108429 A1 | 5/2007 | Lung |
| 2004/0114317 A1 | 6/2004 | Chiang et al. | | 2007/0108430 A1 | 5/2007 | Lung |
| 2004/0165422 A1 | 8/2004 | Hideki et al. | | 2007/0108431 A1 | 5/2007 | Chen et al. |
| 2004/0248339 A1 | 12/2004 | Lung | | 2007/0109836 A1 | 5/2007 | Lung |

| | | |
|---|---|---|
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0079091 A1 | 4/2008 | Park et al. |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0259672 A1 | 10/2008 | Lung |
| 2008/0265234 A1 | 10/2008 | Breitwisch et al. |
| 2008/0303014 A1 | 12/2008 | Goux et al. |
| 2008/0310208 A1 | 12/2008 | Daley |
| 2008/0316794 A1 | 12/2008 | Philipp et al. |
| 2009/0001341 A1 | 1/2009 | Breitwisch et al. |
| 2009/0014704 A1 | 1/2009 | Chen et al. |
| 2009/0017577 A1 | 1/2009 | An et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0230505 A1* | 9/2009 | Dennison ............... 257/522 |
| 2009/0242865 A1* | 10/2009 | Lung et al. ............ 257/2 |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |

FOREIGN PATENT DOCUMENTS

| | | |
|---|---|---|
| WO | 2004025659 A1 | 3/2004 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pages.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, Apr. 17-21, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM Dec. 13-15, 2004, 4 pp.
Lai, Stefan, "Current Status of the Phase Change Memory and Its Future," IEEE IEDM Dec. 10, 2003, pp. 255-258.
Lai, Stephan et al., "OUM-A 180 nm Nonvolatile Memory Cell Element Technology for Stand Alone and Embedded Applications," IEEE IEDM Dec. 2-5, 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Li, Yiming, "Temperature dependence on the contact size of GeSbTe films for phase change memories," J. Comput Electron (2008) 7:138-141.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
Rochefort, C. et al., "Manufacturing of High Aspect-Ration p-n Junctions Using Vapor Phase Doping for Application in Multi-Resurf Devices," IEEE Jun. 4-7, 2002, pp. 237-240.
Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.
Strauss, Karl F. et al., "Overview of Radiation Tolerant Unlimited Write Cycle Non-Volatile Memory," IEEE Mar. 18-25, 2000, pp. 399-408.
Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.
Wicker, Guy et al., Nonvolatile, High Density, High Performance Phase Change Memory, 1999, http://klabs.org/richcontent/MAPLDCon99/Papers/P21_Tyson_P.PDF#search='nonvolatile %20high%20density%20high%20performance%20phase%20 change%20memory', 8pages.
Wicker, Guy, "A Comprehensive Model of Submicron Chalcogenide Switching Devices," Doctoral Dissertation, Wayne State University, Detroit, MI 1996, 137 pp.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yamada, Noboru, "Potential of Ge-Sb-Te phase-change optical disks for high-data-rate recording in the near future," (Conference Proceedings Paper), Jul. 30, 1997, vol. 3109, 10 pages.
Yi, J. H. et al., "Novel Cell Structure of PRAM with Thin Metal Layer Inserted GeSbTe," IEEE IEDM Dec. 10, 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Notice of Allowance, mailed Mar. 1, 2010, U.S. Appl. No. 11/736,440.
Office Action mailed Mar. 31, 2009, U.S. Appl. No. 11/855,979.
Response to Mar. 31, 2009 Office Action filed May 27, 2009, U.S. Appl. No. 11/855,979.
Notice of Allowance mailed Sep. 14, 2009, U.S. Appl. No. 11/855,979.
Office Action mailed Mar. 5, 2009, U.S. Appl. No. 11/855,983.
Response to Mar. 5, 2009 Office Action filed Jun. 15, 2009, U.S. Appl. No. 11/855,983.
Office Action mailed Oct. 13, 2009, U.S. Appl. No. 11/855,983.
Response to Oct. 13, 2009 Office Action filed Mar. 11, 2010, U.S. Appl. No. 11/855,983.
Office Action mailed Jul. 1, 2010, U.S. Appl. No. 11/855,983.

* cited by examiner

CROSS-POINT SELF-ALIGNED REDUCED CELL SIZE PHASE CHANGE MEMORY

PARTIES TO A RESEARCH AGREEMENT

International Business Machines Corporation, a New York corporation and Macronix International Corporation, Ltd., a Taiwan corporation, are parties to a Joint Research Agreement

BACKGROUND

This invention relates to high density memory devices based on phase change memory materials, including chalcogenide based materials, and on other programmable resistance materials, and methods for manufacturing such devices.

Phase change based memory materials, such as chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state. The magnitude of the current needed for reset can be reduced by reducing the size of the phase change material element in the cell and/or the contact area between electrodes and the phase change material, such that higher current densities are achieved with small absolute current values through the phase change material element.

It is desirable to increase the density of memory cells in a memory cell array. As feature sizes are reduced, proper alignment of the memory cells with the corresponding access devices and with the word lines and bit lines presents challenges.

It is also desirable to reduce process cost in the manufacture of memory devices.

SUMMARY

In general, a cross-point programmable memory array is disclosed in which the programmable memory cells are aligned at the access devices and at the cross-points of the bit lines and the word lines. A layer of peripheral logic devices is formed at the surface of the semiconductor substrate body and the programmable memory elements are formed over the surface of the semiconductor substrate body, so that a plane defined by the peripheral logic gates intersects the programmable memory elements. A method for making the memory array employs a damascene process in forming one or both the bit lines and the word lines; and the bit line is (or both the bit line and the word line are) self-aligned with the access devices and the programmable memory elements.

The bit lines are defined in the substrate between first isolation structures formed in trenches parallel to the bit line direction. Second isolation structures are formed in trenches parallel to the word line direction, shallower than the first isolation trenches. The first and second isolation structures extend above the semiconductor surface. The memory cell access devices are formed in the semiconductor substrate, and they are confined in one direction between the first isolation structures and in a perpendicular direction between the second isolation structures.

The word lines and the programmable memory elements are formed in word line trenches overlying the memory cell access devices, and are confined between the first isolation structures above the semiconductor substrate surface. As a result, the programmable memory elements and the access devices and the bit lines are all "self-aligned".

In some embodiments a hard mask is used to define the second (word line) isolation trenches, and this hard mask can be left in place until the programmable memory elements and the word lines are to be formed; in these embodiments a fill can be formed over the second isolation trenches, and portions of the hard mask overlying the memory cell access devices can be selectively removed to form the word line trenches. As a result, in such embodiments the word lines, the programmable memory elements and the access devices are all "self-aligned".

In other embodiments no hard mask is left in place, and an additional mask is used to define the word line trenches overlying the memory cell access devices. In such embodiments, the word lines and the programmable memory elements are "self-aligned" (they are formed in the word line trench by a damascene process), but the word lines and programmable memory elements are not self-aligned with the memory cell access devices.

A method for making the memory array employs a damascene process in forming one or both the bit lines and the word lines; and the bit line is (or both the bit line and the word line are) self-aligned with the access devices and the programmable memory elements.

In one aspect the invention features a programmable memory device including a semiconductor substrate body having a surface including a periphery region and a memory array region, the device including a programmable memory array in the memory array region and a layer of logic devices at the substrate surface in the periphery region, the memory array including access devices formed in the substrate body and programmable memory elements formed over the substrate surface, in which the access devices and memory elements are aligned at cross-points of bit lines and word lines, and the bit lines are self-aligned with the programmable memory elements and the access devices. In some such devices the word lines are self-aligned with the programmable memory elements and the access devices.

In another aspect the invention features a programmable memory device including a semiconductor substrate body having a surface including a periphery region and a memory array region, the device including a programmable memory array in the memory array region and a layer of logic devices at the substrate surface in the periphery region, the memory array including access devices formed in the substrate body and programmable memory elements formed over the substrate surface, in which a plane defined by peripheral logic gates intersects the programmable memory elements. In some such embodiments the access devices and memory elements are aligned at cross-points of bit lines and word lines, and the bit lines are self-aligned with the programmable memory elements and the access devices. In some such devices the word lines are self-aligned with the programmable memory elements and the access devices.

In another aspect the invention features a method for making a programmable memory array, by: providing a semiconductor substrate having a surface overlying a memory array region and a periphery region; depositing a gate oxide layer and a gate layer over the substrate surface; forming first trench isolation structures parallel to a first direction using a common mask over both the memory array region and the periphery region; removing the common mask and forming a silicon nitride layer over the gate layer and the first trench isolation structures; forming second trenches parallel to a second direction perpendicular to the first direction; forming a dielectric fill over the memory array region; patterning the periphery gate oxide layer and gate layer using a logic mask over the periphery region to form logic gates; performing a device implant in the periphery region to form source and drain regions; forming a dielectric fill over the memory array region and the periphery region and planarizing the dielectric fill; removing the silicon nitride layer and the gate layer and gate oxide layer over the memory array to form word line trenches; forming spacers on the first and second trench isolation structures in the memory array region to form pores; and forming at least one of memory cells or word lines in the word line trenches.

In another aspect the invention features a method for making a programmable memory array, by: providing a semiconductor substrate having a surface overlying a memory array region and a periphery region; depositing a gate oxide layer and a gate layer over the substrate surface; forming first trench isolation structures parallel to a first direction using a common mask over both the memory array region and the periphery region; removing the common mask and forming second trenches parallel to a second direction perpendicular to the first direction; forming a dielectric fill over the memory array region; patterning the periphery gate oxide layer and gate layer using a logic mask over the periphery region to form logic gates; performing a device implant in the periphery region to form source and drain regions; forming a dielectric fill over the memory array region and the periphery region and planarizing the dielectric fill; removing the gate layer and gate oxide layer over the memory array to form word line trenches; forming spacers on the first and second trench isolation structures in the memory array region to form pores; and forming at least one of memory cells or word lines in the word line trenches.

In some embodiments the method further includes one or more of: following forming the second trenches, forming a first memory array salicide; prior to forming the dielectric fill over the memory array region and the periphery region, forming a peripheral region salicide; prior to forming the spacers in the memory array region, forming a second memory array salicide.

In some embodiments the method further includes forming memory access device implants at one or more stages: prior to depositing the gate oxide layer over the substrate surface, following forming the second trenches, prior to forming spacers in the memory array region. In some embodiments the method further includes forming peripheral device implants in the substrate underlying the peripheral region at one or more stages: prior to depositing the gate oxide layer over the substrate surface, following forming the logic gates.

In some embodiments forming the second trenches includes forming a mask over the silicon nitride layer and, using the mask, etching to form the second trenches.

In some embodiments forming the memory cells includes depositing a programmable memory material over the second memory array salicide in the word line trenches and forming a top electrode over the programmable memory material. In some embodiments forming the memory cells includes depositing a bottom electrode material over the second memory array salicide in the word line trenches, depositing a programmable memory material over the bottom electrode material, and forming a top electrode over the programmable memory material.

In some embodiments forming memory cells over the second memory array salicide includes forming a mask over the memory array region and the periphery region, patterned to form word line trenches overlying the second memory array salicide; and depositing a programmable memory material and a top electrode in the word line trenches.

In some embodiments forming the memory cells includes depositing a programmable memory material over the second memory array salicide and forming a top electrode over the programmable memory material. In some embodiments forming the memory cells includes depositing a bottom electrode material over the second memory array salicide, depositing a programmable memory material over the bottom electrode material, and forming a top electrode over the programmable memory material.

In some embodiments the method further includes, following forming memory cells, forming a passivation layer over the memory array region and the periphery region; and forming contacts through the passivation layer to top electrodes in the memory array region and to source/drain regions in the periphery region.

In some embodiments memory cells in the memory array have an area equal to $4D^2$, where D is about one half the sum of the word line width and the separation distance between word lines, typically about the minimum feature size for a lithographic process used in manufacturing the memory cells.

The structure can be formed using a self-aligned process in which the word lines and memory elements are aligned with the vertical transistors without additional patterning steps. Also, the memory material is not exposed to etching chemistry during processing, leaving the memory elements damage free.

The disclosed methods provide a memory array of cells having reduced cell size, and the methods have a low processing cost, as a reduced number of masks are required.

BRIEF DESCRIPTION OF THE DRAWINGS

FIG. 2A is a plan view, FIG. 2B is a transverse sectional view as indicated at B-B in FIG. 2A, and FIG. 2C is a transverse sectional view as indicated at C-C in FIG. 2A.

Figure 7D:
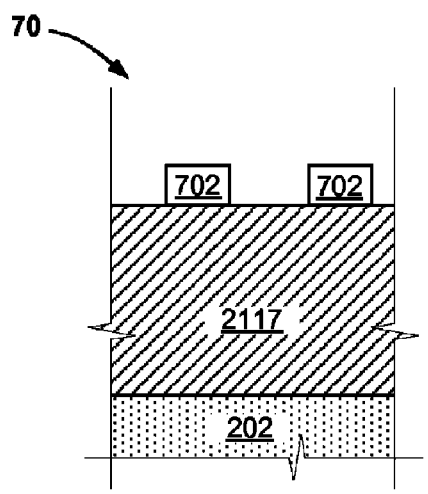
Figure 7E:
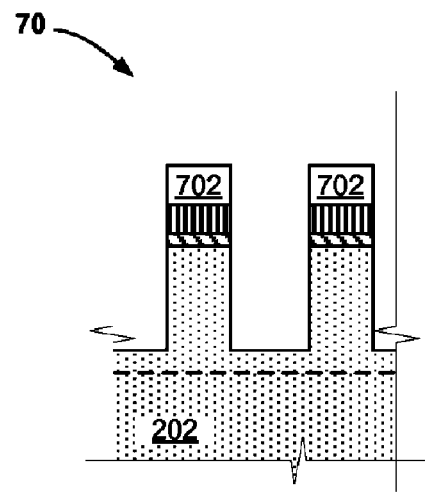
Figure 7A:
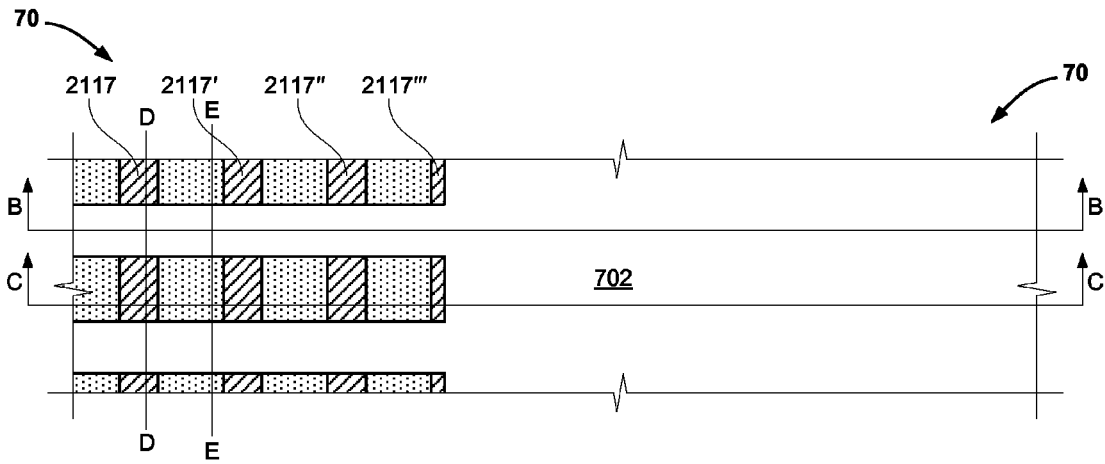
Figure 7B:
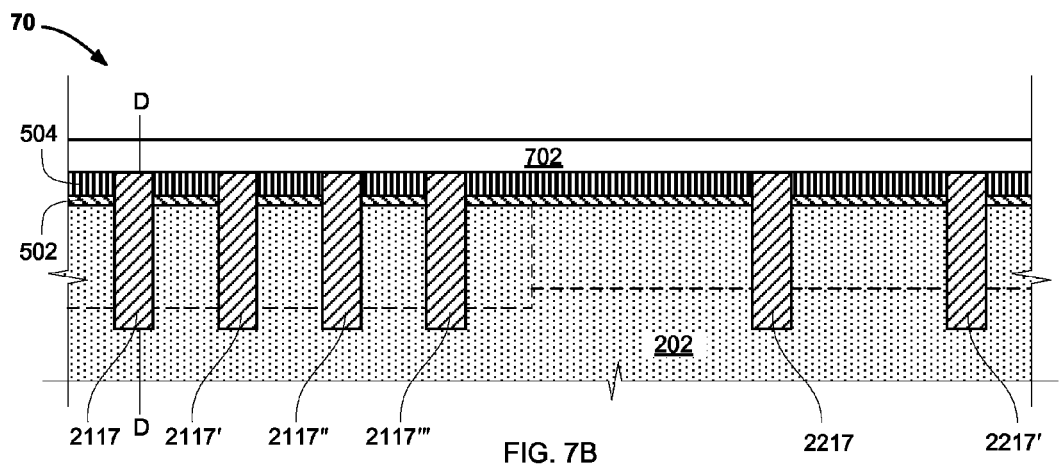
Figure 7C:
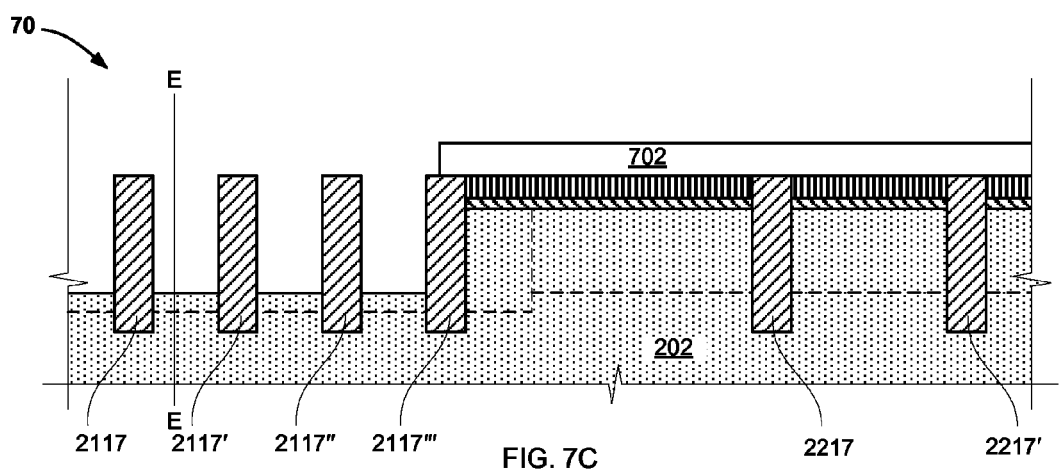
Figure 8A:
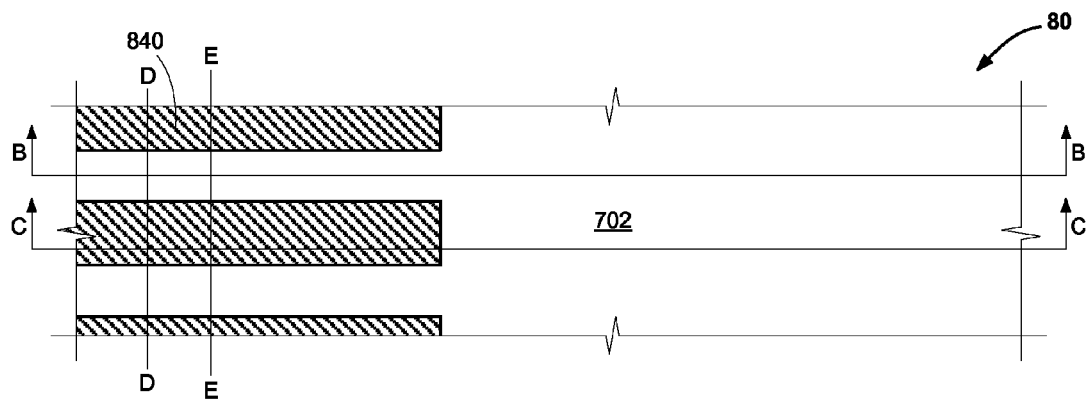
Figure 8B:
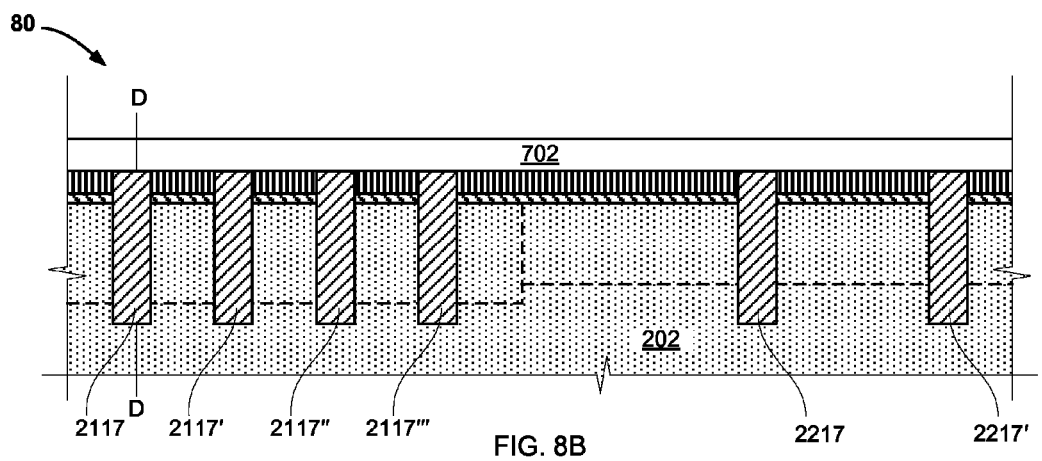
Figure 8C:
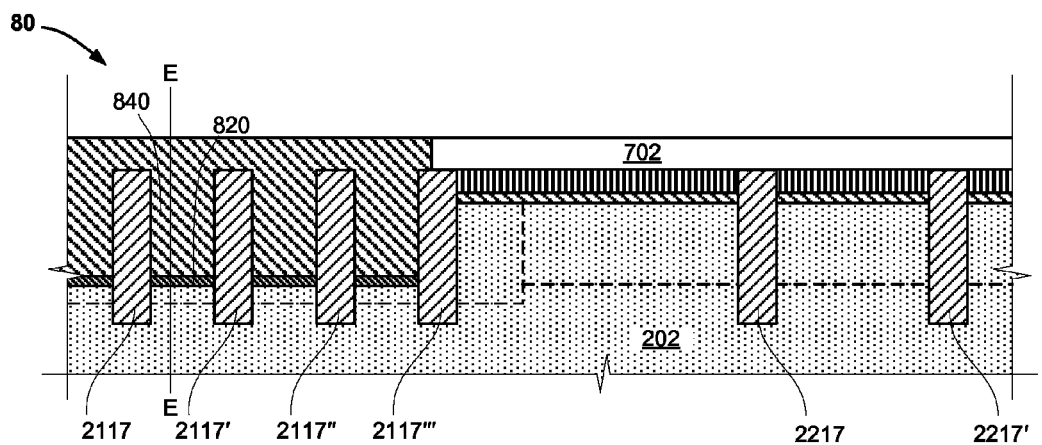
Figure 8D:
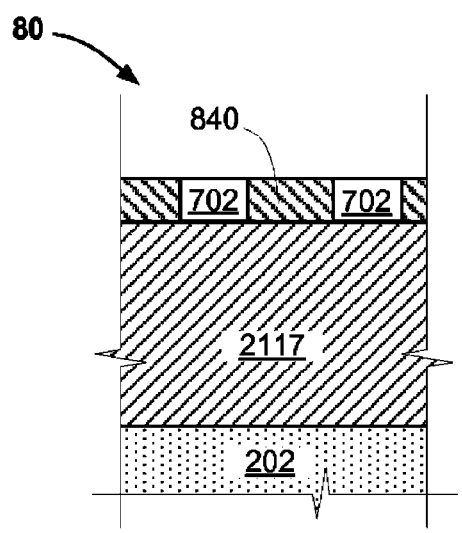
Figure 8E:
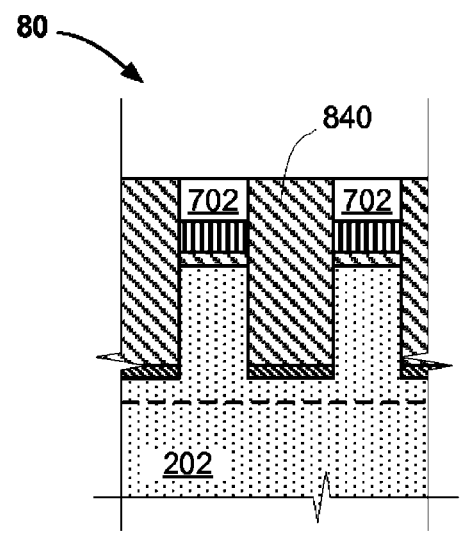
Figure 9A:
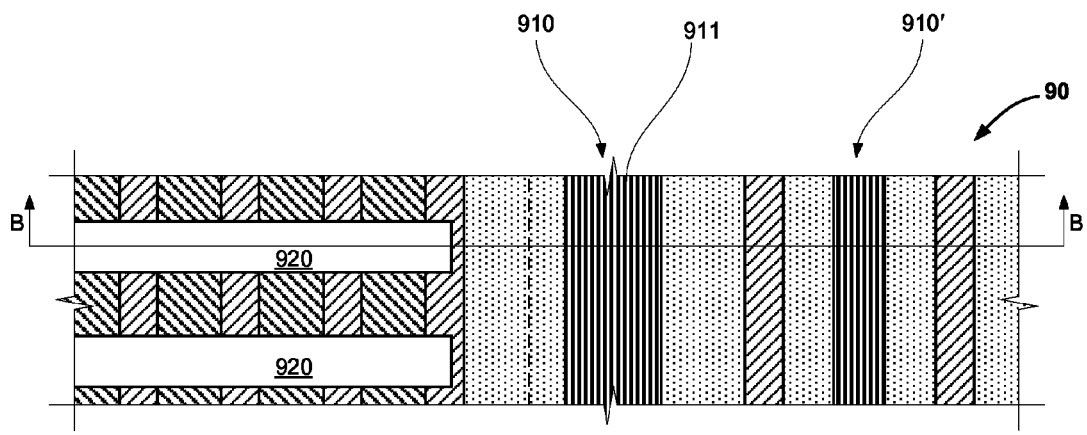
Figure 9B:
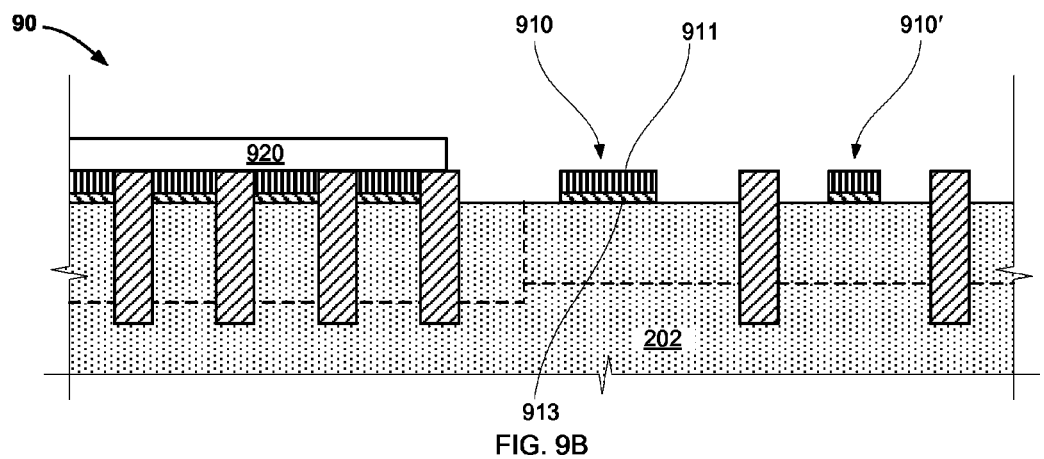
Figure 10A:
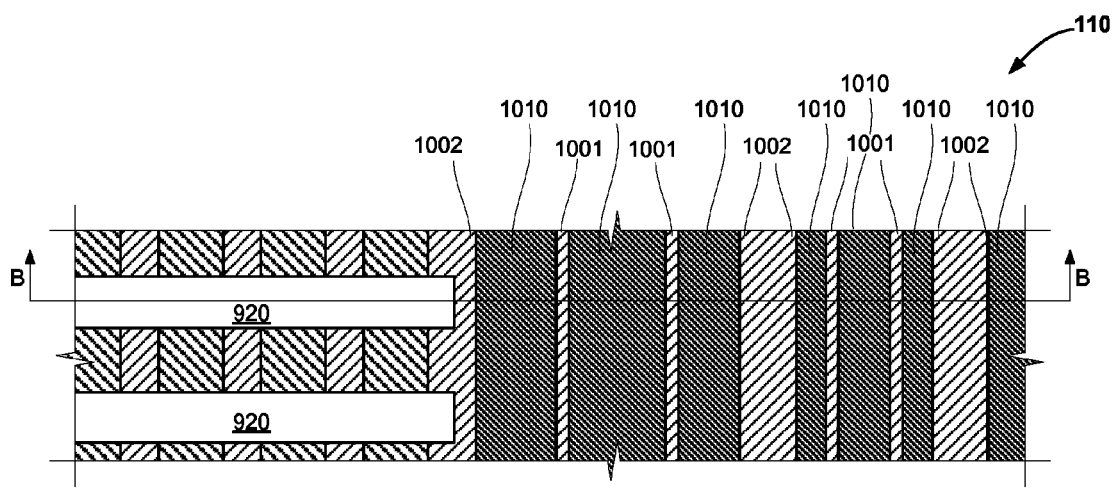
Figure 10B:
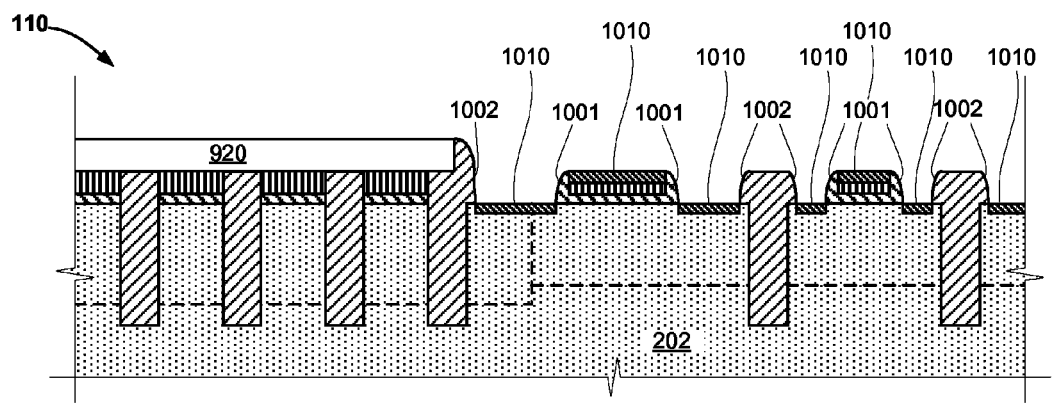
Figure 11A:
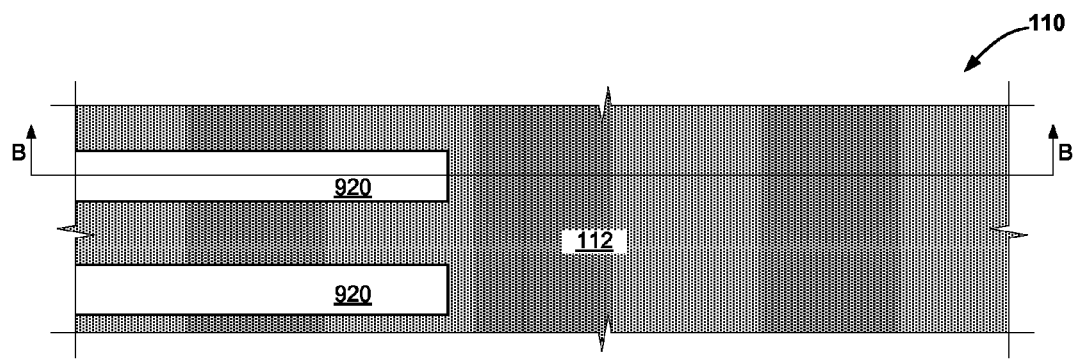
Figure 11B:
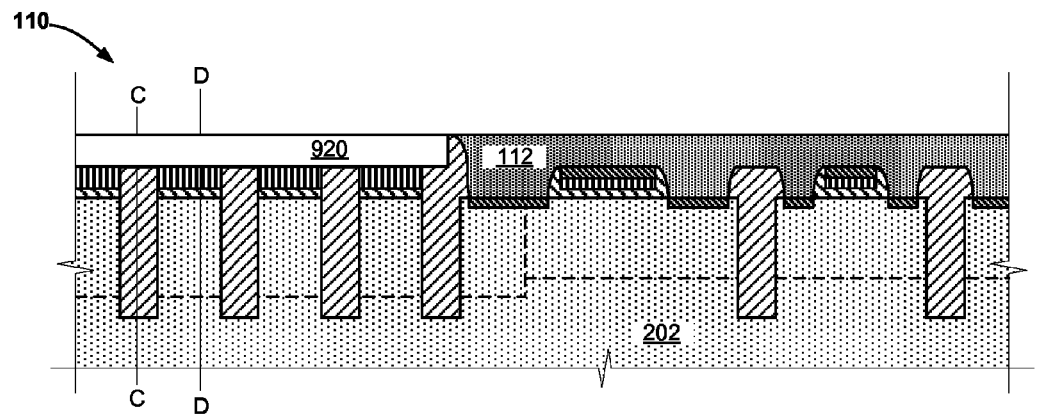
Figure 11C:
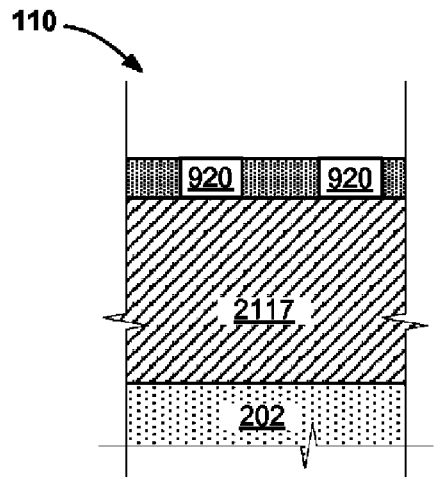
Figure 11D:
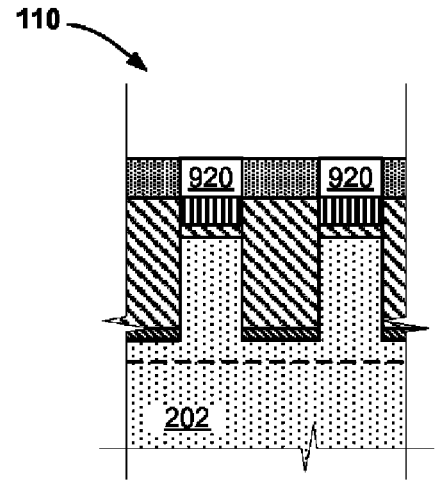

(The various views are identified according to the following scheme: in each instance a FIG. labeled A (for example, 7A) is a plan view, a FIG. labeled B is a transverse sectional view as indicated at B-B in the corresponding plan view, and a FIG. labeled C, D, or E is a transverse sectional view as indicated at C-C, D-D, or E-E, in a corresponding view. For example, FIG. 7B is a transverse sectional view as indicated at B-B in FIG. 7A, FIG. 7C is a transverse sectional view as indicated at C-C in FIG. 7A, FIG. 7D is a transverse sectional view as indicated at D-D in FIGS. 7A and 7B, FIG. 7E is a transverse sectional view as indicated at E-E in FIGS. 7A and 7C.)

Figure 18:
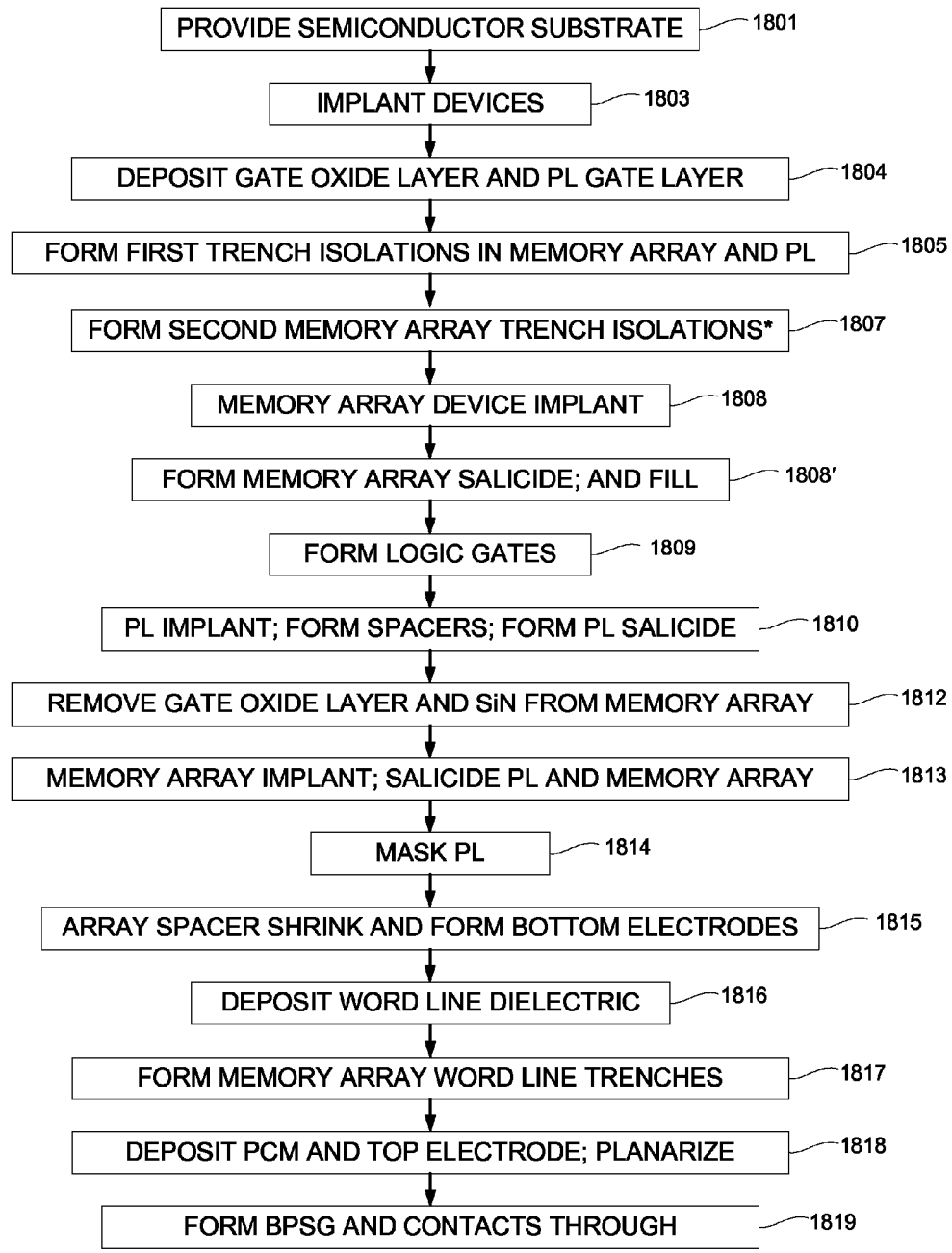
Figure 19A:
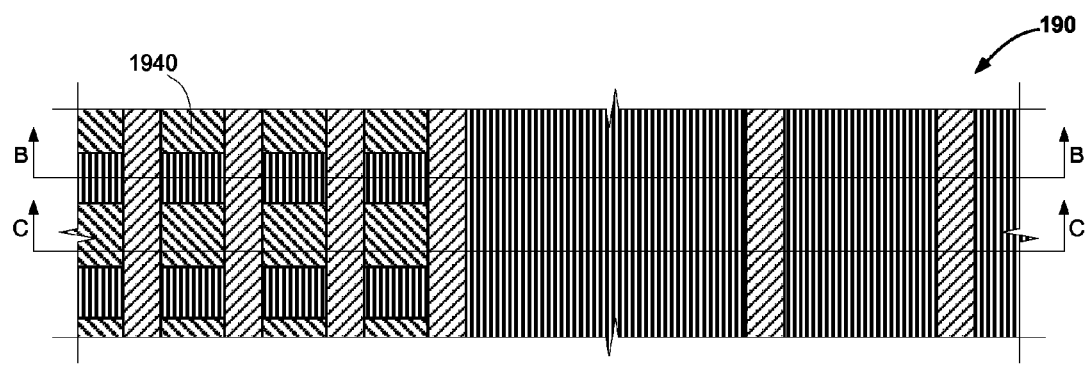
Figure 19B:
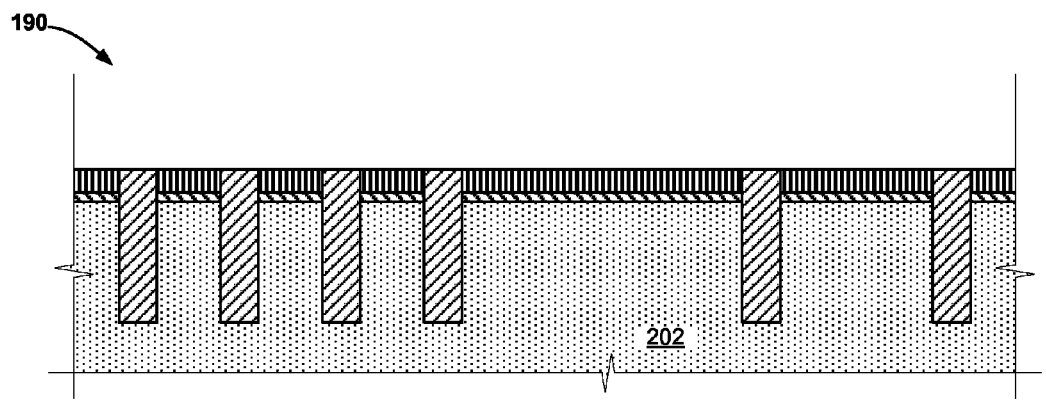
Figure 19C:
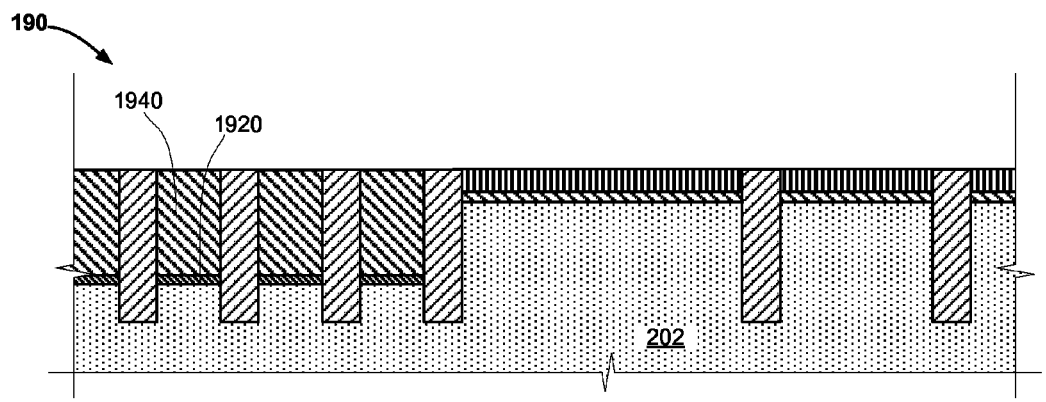
Figure 20A:
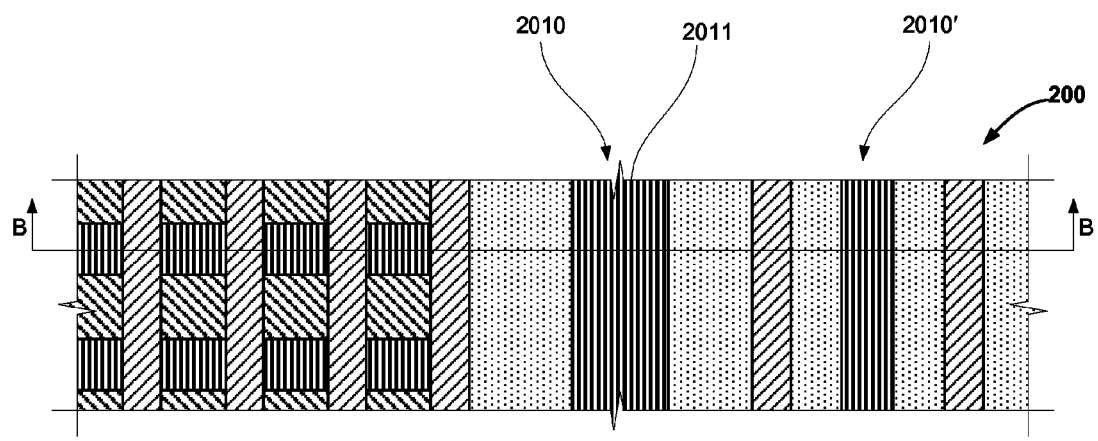
Figure 20B:
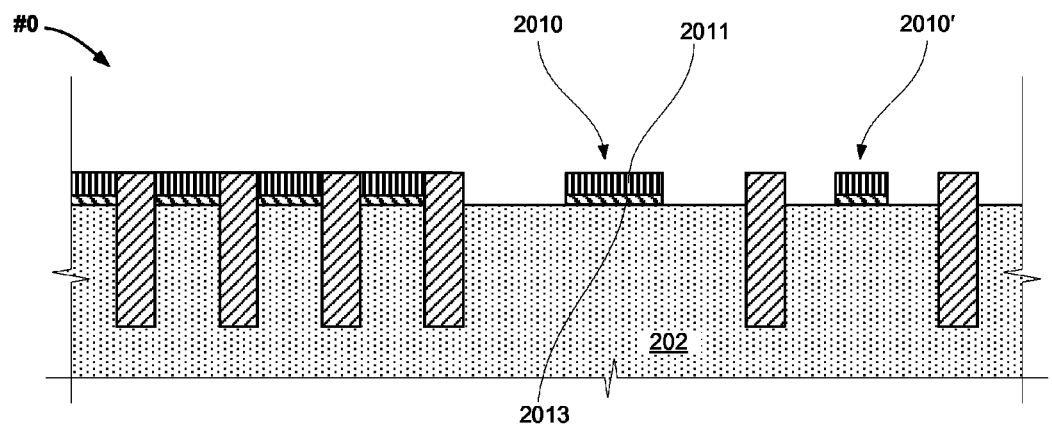
Figure 21A:
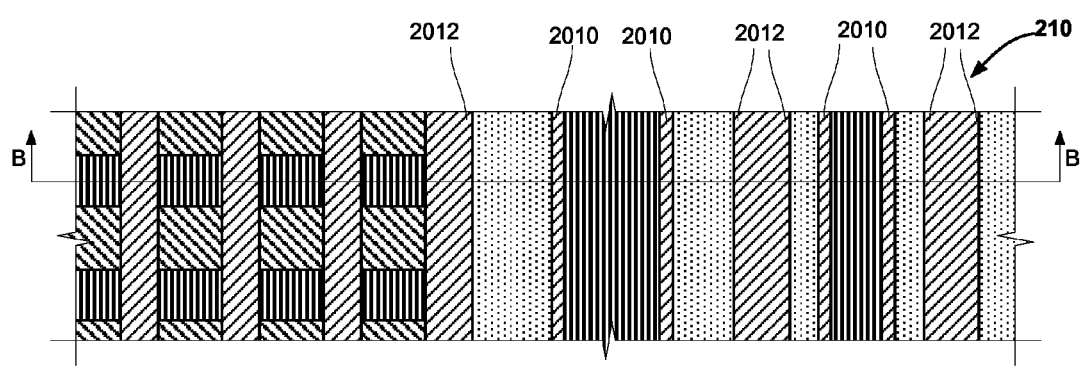
Figure 21B:
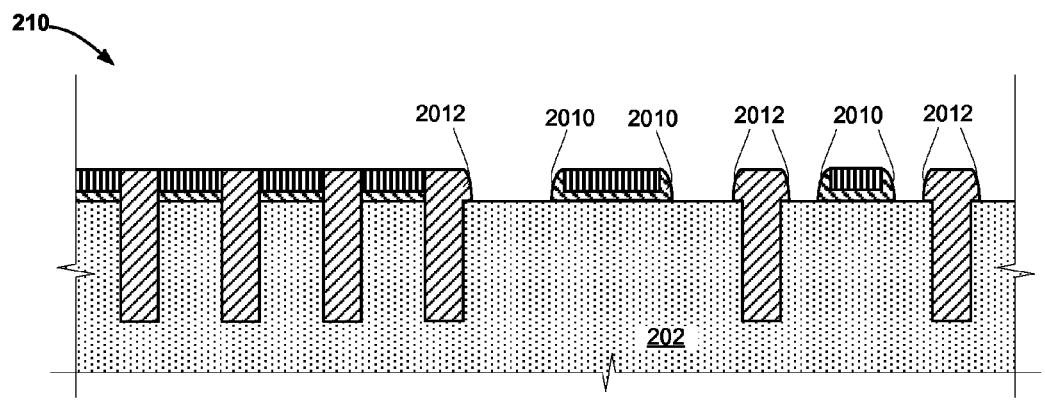

FIG. 18 is a flow diagram outlining stages in a process for making a phase change memory according to another embodiment.

FIGS. 19A, 19B, 19C, 20A, 20B, 21A, 21B, 22A, 22B, 23A, 23B, 24A, 24B, 25A, 25B, 26A, 26B, 26C, 27A, 27B, 28A, 28B, are diagrammatic sketches showing stages in a process for making a phase change memory according to an embodiment. (The various views are identified according to the scheme outlined above.)

Figure 29:
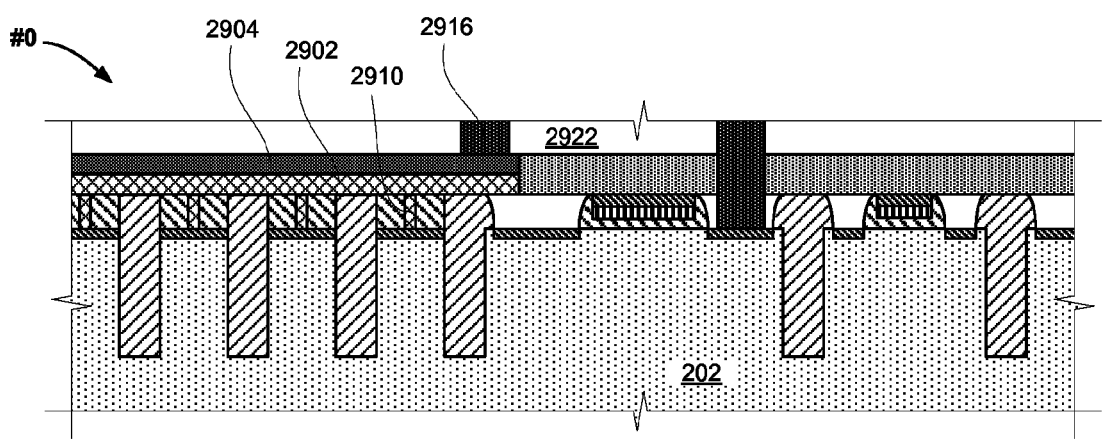
Figure 30:
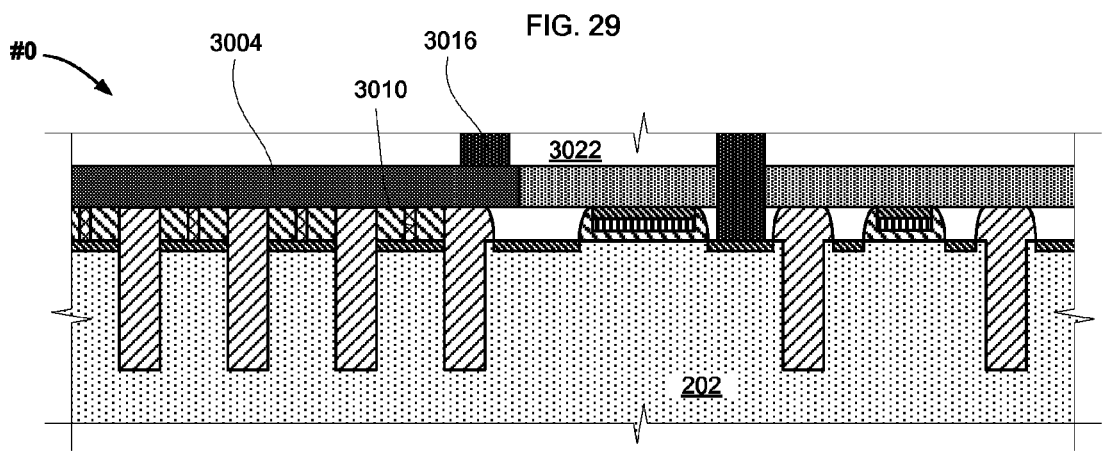

FIGS. 29, 30 are diagrammatic sketches in sectional view illustrating examples of embodiments.

Figure 31:
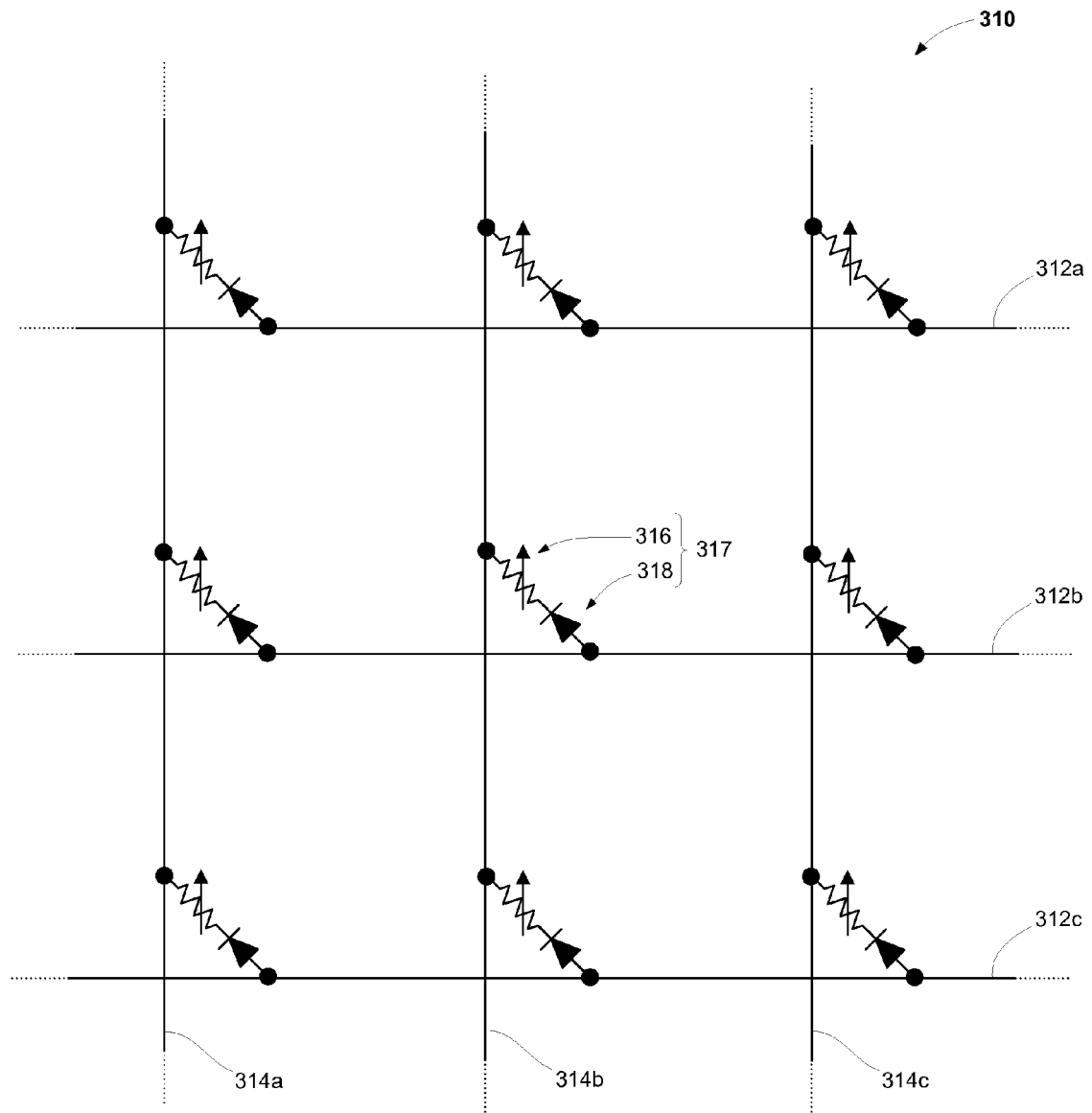

FIG. 31 is a schematic diagram for a memory array implemented using memory cells as described herein.

Figure 32:
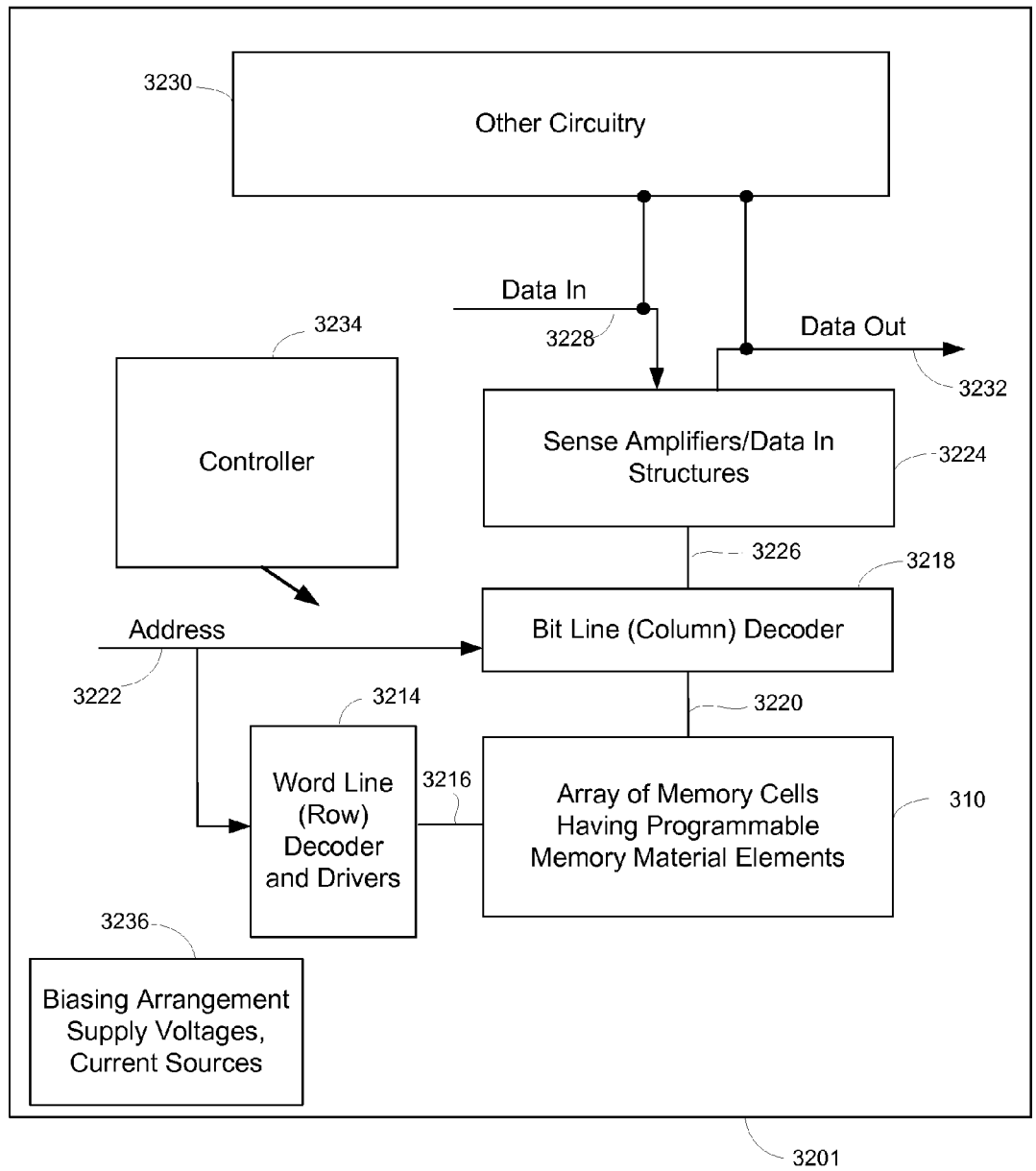

FIG. 32 is a simplified block diagram of an integrated circuit including an array of memory cells having access devices and memory elements as described herein.

DETAILED DESCRIPTION

The invention will now be described in further detail by reference to the drawings, which illustrate alternative specific embodiments and methods. The drawings are diagrammatic, showing features of the embodiments and their relation to other features and structures, and are not made to scale. For improved clarity of presentation, in the FIGs. illustrating various embodiments, elements corresponding to elements shown in other drawings are not all particularly renumbered, although they are all readily identifiable in all the FIGs. Also for clarity of presentation certain features are not shown in the figures, where not necessary for an understanding of the invention. It is to be understood that there is no intention to limit the invention to the specifically disclosed embodiments and methods and that the invention may be practiced using other features, elements, methods and embodiments. Particular embodiments are described to illustrate the present invention, not to limit its scope, which is defined by the claims. Those of ordinary skill in the art will recognize a variety of equivalent variations on the description that follows.

FIG. 31 is a schematic illustration of a memory array 310, which can be implemented using memory cells as described herein. In this example, each memory cell 317 includes a diode access device 318 and a programmable resistance memory element 316 (represented as a variable resistor) arranged in series along a current path between a corresponding word line 312 and a corresponding bit line 314. As described in more detail below, the memory element in a given memory cell is programmable to a plurality of resistance states including a first and a second resistance state.

The array comprises a plurality of word lines 312 including word lines 312a, 312b, and 312c extending in parallel in a first direction, and a plurality of bit lines 314 including bit lines 314a, 314b, and 314c extending in parallel in a second direction perpendicular to the first direction. The array 310 is referred to as a cross-point array because the word lines 312 and bit lines 314 cross each other but do not physically intersect, and the memory cells 317 are located at these cross-point locations of the word lines 312 and bit lines 314.

Memory cell 317 is representative of the memory cells of array 310 and is arranged at the cross-point location of the word line '312b and the bit line 314b, the memory cell 317 including (in this example) a diode 318 and a memory element 316 arranged in series. The diode 318 is electrically coupled to the word line 312b and the memory element 316 is electrically coupled to the bit line 314b.

Reading or writing to memory cell 317 of array 310 can be achieved by applying appropriate voltage pulses to the corresponding word line 312b and bit line 314b to induce a current through the selected memory cell 317. The level and duration of the voltages applied is dependent upon the operation performed, e.g., a reading operation or a programming operation.

In a read (or sense) operation of the data value stored in the memory cell 317, bias circuitry (see, e.g., biasing arrangement supply voltages, current sources 3236 of FIG. 32) coupled to the corresponding word line 312b and bit line 314b to apply bias arrangements across the memory cell 317 of suitable amplitude and duration to induce current to flow which does not result in the memory element 316 undergoing a change in resistive state. The current through the memory cell 317 is dependent upon the resistance of the memory element 316 and, thus, upon the data value stored in the memory cell 317. The data value may be determined, for example, by comparison of the current on the bit line 314b with a suitable reference current by sense amplifiers (see, e.g., sense amplifiers/data in structures 3224 of FIG. 32).

In a program operation of a data value to be stored in the memory cell 317, bias circuitry (see, e.g., biasing arrangement supply voltages, current sources 3236 of FIG. 32) coupled to the corresponding word line 312b and bit line 314b to apply bias arrangements across the memory cell 317 of suitable amplitude and duration to induce a programmable change in the memory element 316 to store the data value in the memory cell 317, the electrical resistance of the memory element 316 corresponding to the data value stored in the memory cell 317.

The bias arrangements include a first bias arrangement sufficient to forward bias the diode 318 and change the resistance state of the memory element 317 from a resistance corresponding to a first programmed state to a resistance corresponding to a second programmed state. The bias arrangements also include a second bias arrangement sufficient to forward bias the diode 318 and change the resistance state of the memory element 317 from a resistance corresponding to the second programmed state to a resistance corresponding to the first programmed state. In various embodiments the bias arrangements for unipolar operation of the memory element 317 may each comprise one or more voltage pulses, and the voltage levels and pulse times can be determined empirically for each embodiment.

FIG. 32 is a simplified block diagram of an integrated circuit 3201 including a cross-point memory array 310 of memory cells. In this example, each memory cell includes a diode access device and a programmable resistance memory element. A word line (row) decoder 3214 is coupled to and in electrical communication with a plurality of word lines 3216. A bit line (column) decoder 3218 is in electrical communication with a plurality of bit lines 3220 to read data from, and write data to, the memory cells (not shown) in array 310. Addresses are supplied on bus 3222 to word line decoder and devices 3214 and bit line decoder 3218. Sense amplifiers and data-in structures in block 3224 are coupled to bit line decoder 3218 via data bus 3226. Data are supplied via a data-in line 3228 from input/output ports on integrated circuit 3201, or from other data sources internal or external to integrated circuit 3201, to data-in structures in block 3224. Other circuitry 3230 may be included on integrated circuit 3201, such as a general purpose processor or special purpose application circuitry, or a combination of modules providing system-on-a-chip functionality supported by array 310. Data are supplied via a data-out line 3232 from the sense amplifiers in block 3224 to input/output ports on integrated circuit 3201, or to other data destinations internal or external to integrated circuit 3201.

A controller 3234 implemented in this example, using a bias arrangement state machine, controls the application of bias arrangement supply voltages 3236, such as read, program, and program verify voltages. Controller 3234 may be implemented using special-purpose logic circuitry as known in the art. In alternative embodiments, controller 3234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 3234.

Embodiments of the programmable resistance material of the memory material element include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, columns 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Other materials, which may be termed "impurities" may be added to chalcogenides and other phase change materials in some embodiments to modify conductivity, transition temperature, melting temperature, and other properties of memory elements using the additive-modified chalcogenides. Representative impurities used as additives for chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, e.g., U.S. Patent Application Publication No. 2007/0176251, titled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, e.g., N. E. Gilbert et al., "A macro model of programmable metallization cell devices," Solid-State Electronics 49 (2005) 1813-1819, which is incorporated by reference herein.

Figure 2A:
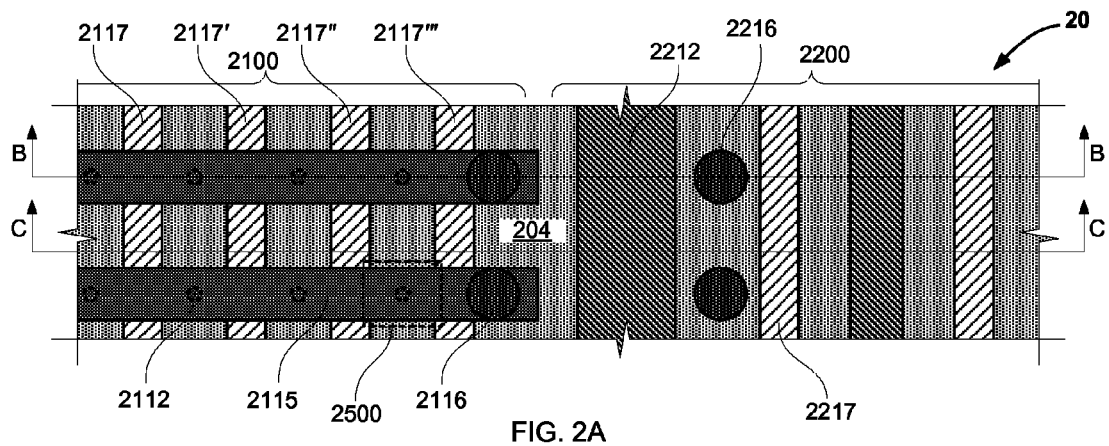
FIGS. 2A, 2B, 2C are diagrammatic sketches showing a phase change memory according to an embodiment.
Figure 2B:
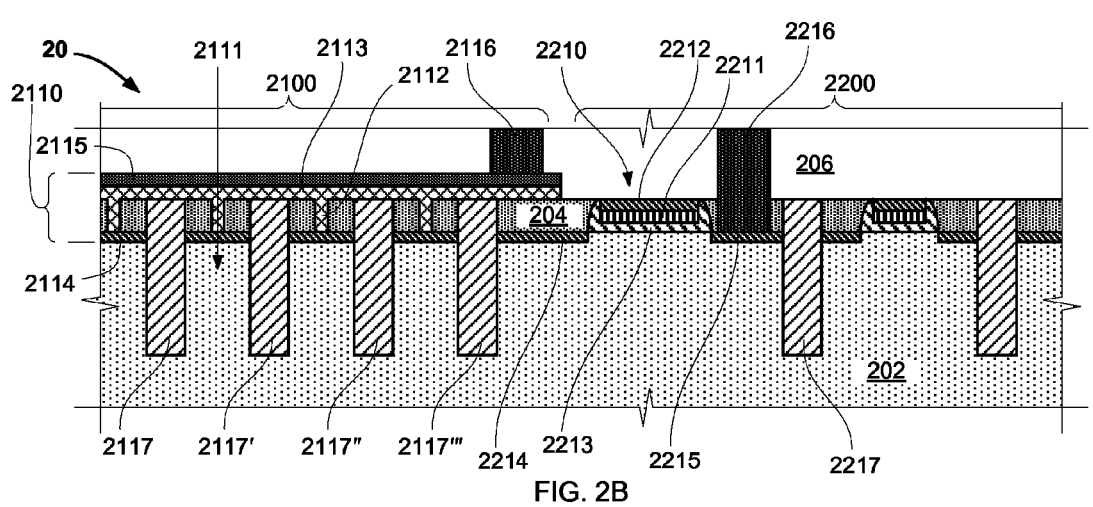
Figure 2C:
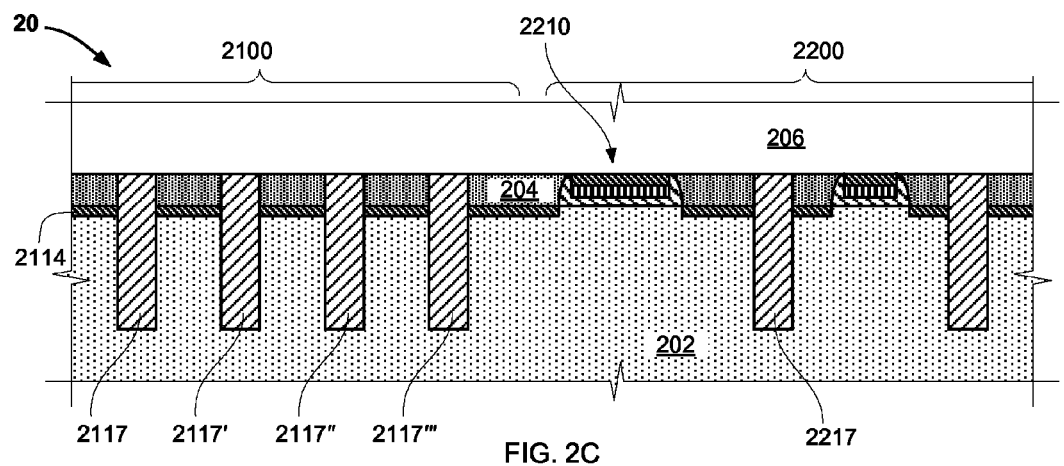

FIGS. 2A, 2B, 2C show portions of a memory 20 including a memory cell array and of peripheral logic circuitry, in a plan view (FIG. 2A), and in sectional views (FIGS. 2B, 2C).

The memory 20 includes a memory region 2100 and a periphery region 2200 on the single-crystalline semiconductor substrate 202. The substrate 202 has a substantially planar top surface. As used herein, the term "substantially planar" is intended to accommodate manufacturing tolerances during the formation of the substrate 202. The term "substantially planar" is also intended to accommodate manufacturing processes performed following the formation of the substrate 202 which may cause variations in the planarity of the top surface.

The periphery region 2200 includes logic devices, isolated by trench isolations, for example trench isolation 2217. Each logic device, such as logic device 2210, for example, has a gate structure on a gate dielectric layer 2213. The gate dielectric layer 2213 is on the top surface of the substrate 202. The gate structure includes a layer 2211 of doped polysilicon on the gate dielectric layer 2213, and a layer 2212 of silicide on the doped polysilicon.

The logic device 2210 includes doped regions 2214, 2215 within the substrate 202 acting as the source and drain regions. A dielectric 206 comprising one or more layers of dielectric material overlies the logic device 2210. (The structure is presented in FIG. 2A as if the dielectric 206 were transparent, so that features beneath it can be seen.)

Contact 2216 is coupled to doped region 2215 and extends to the top surface of dielectric 206 where it can access overlying circuitry.

The memory region 2100 includes an array of access devices (not shown in these FIGs.; the position of one such device is suggested by the arrow 2111), formed in the single-crystalline silicon substrate 202 and isolated by trench isolations, for example trench isolations 2117, 2117', 2117", 2117'''. A salicide layer 2114 overlies the access devices at the surface of the substrate 202 overlying the access devices. The phase change memory cells are constructed over the salicide layer at the top surface of the substrate 202; that is, the phase change memory cells are in the same layer (suggested by the bracket 2110) as the gate structures of the peripheral logic. A variety of phase change memory cell configurations are contemplated (and some examples are described below); in the example shown in these FIGs., the memory material is a "pore structure", including a horizontal portion 2113 and vertical portions 2112; the vertical portions are formed in pores in a surrounding dielectric layer 204. In the example shown here, the horizontal portion 2113 of the phase change memory material element is overlain by a top electrode 2115. Contact 2116 is coupled to top electrode 2115 and extends to the top surface of dielectric 206 where it can access overlying circuitry.

The bit lines 2115 are designed to have a specified bit line width and to be separated by a specified first separation distance. The word lines are designed to have a specified word line width and to be separated by a specified second separation distance. In some embodiments the summation of the specified bit line width and the specified first separation distance equals about twice a feature size D, wherein D is a nominal feature size for the lithographic process used to create the word lines and bit lines; and the summation of the specified word line width and the specified second separation distance equals about twice the feature size D. In these size constraints the memory cell has an area 2500 equal to about $4D^2$.

Figure 1:
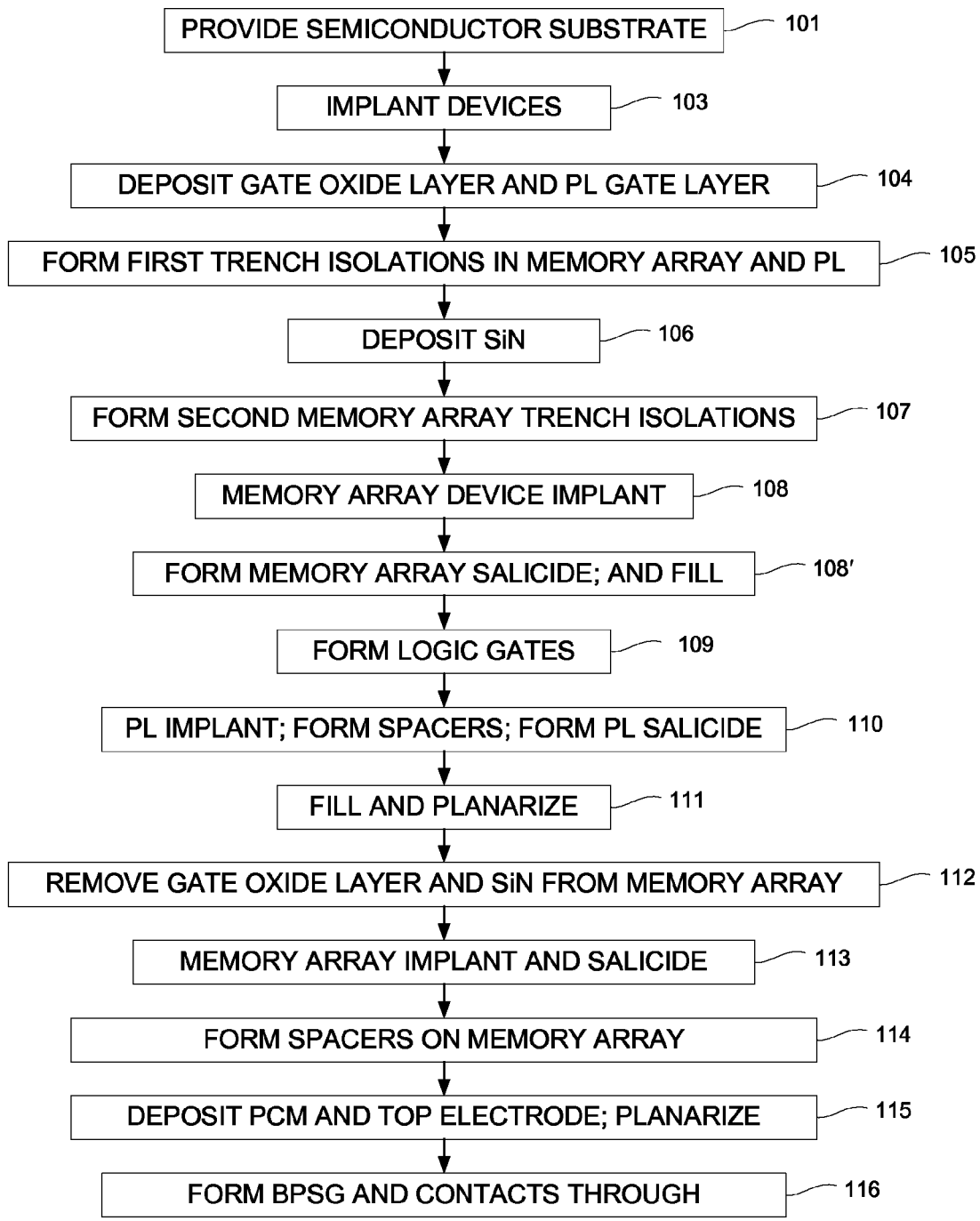
FIG. 1 is a flow diagram outlining stages in a process for making a phase change memory according to an embodiment.

FIG. 1 is a flow diagram outlining stages in a process for making a phase change memory; and FIGS. 3-17 illustrate, in various views, stages in construction of a phase change memory according to an embodiment of the invention.

Figure 3:
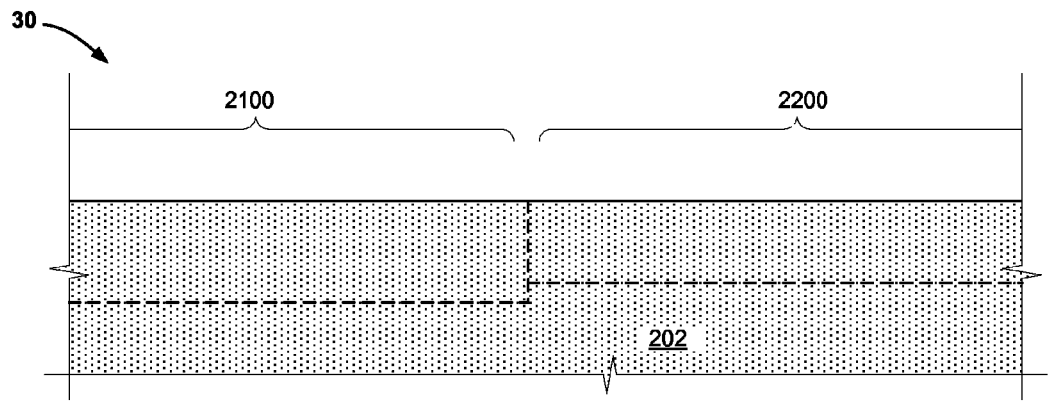
FIGS. 3, 4, 5A, 5B, 6A, 6B, 6C, 7A, 7B, 7C, 7D, 7E, 8A, 8B, 8C, 8D, 8E, 9A, 9B, 10A, 10B, 11A, 11B, 11C, 11D, 12A, 12B, 12C, 12D, 13A, 13B, 13C, 13D, 14A, 14B, 14C, 14D, 15A, 15B, 16A, 16B, 17 are diagrammatic sketches showing stages in a process for making a phase change memory according to an embodiment.
Figure 4:
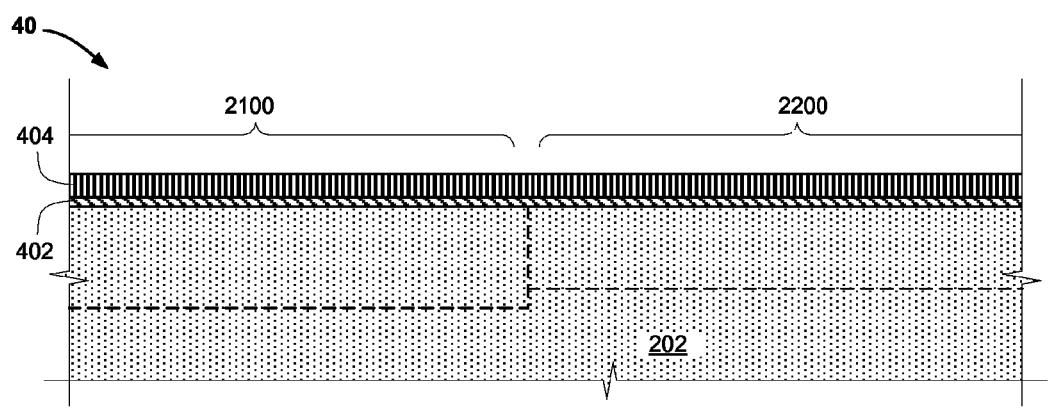
Figure 5A:
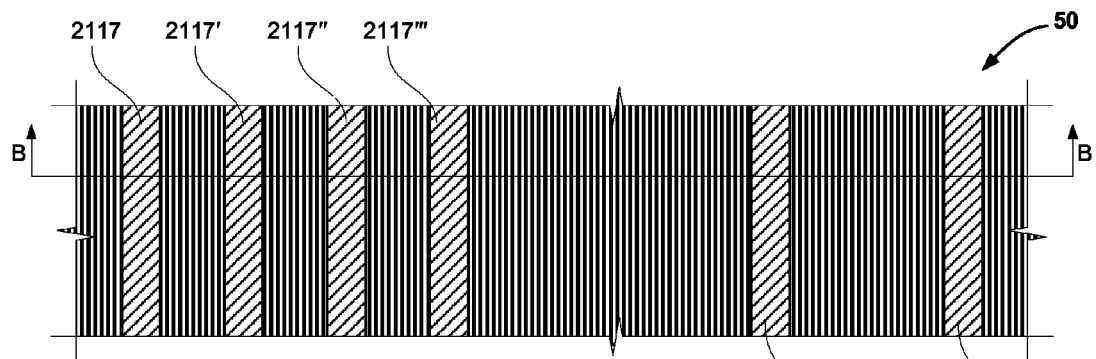
Figure 5B:
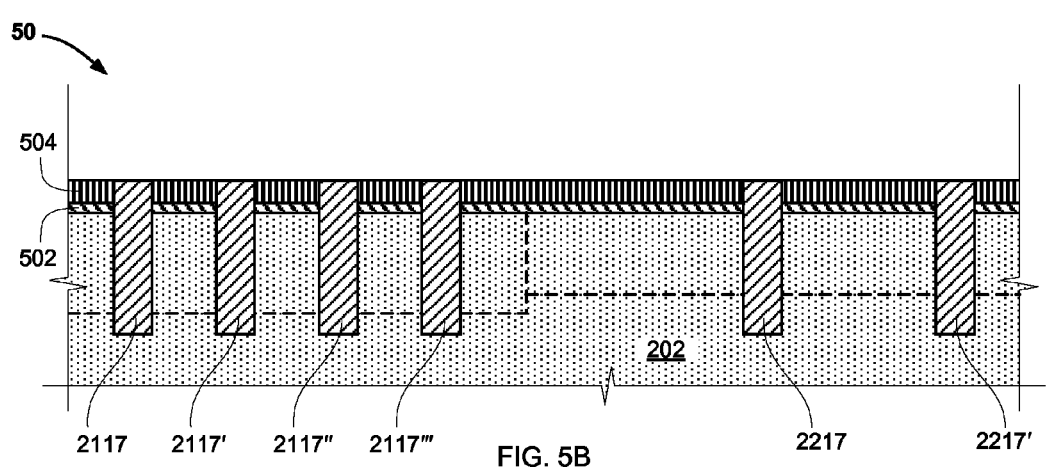
Figure 6A:
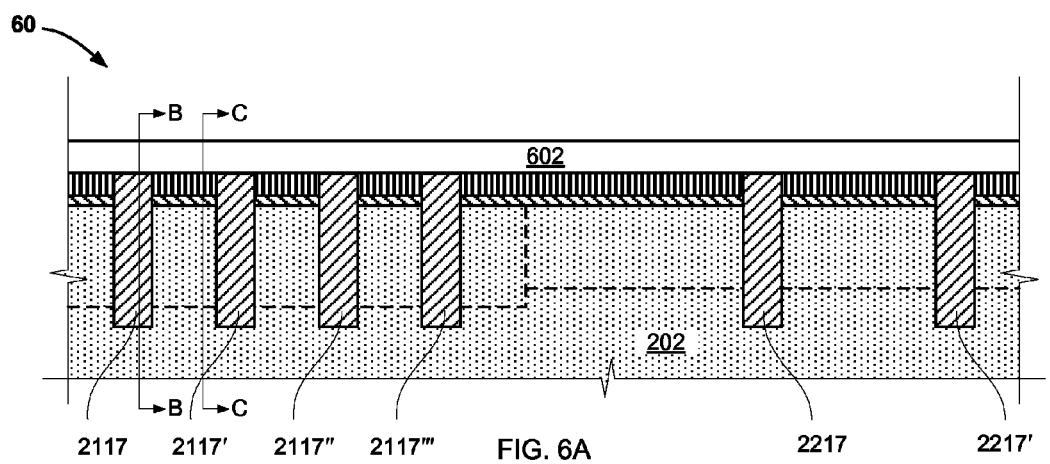
Figure 6B:
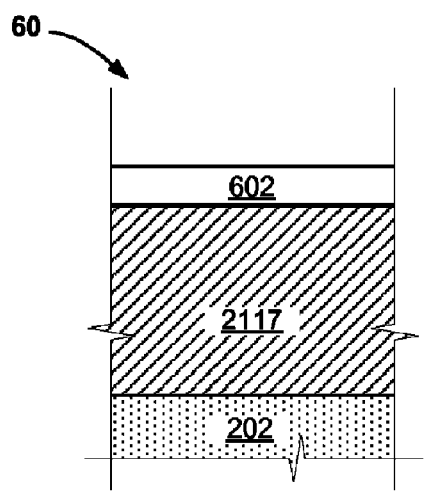
Figure 6C:
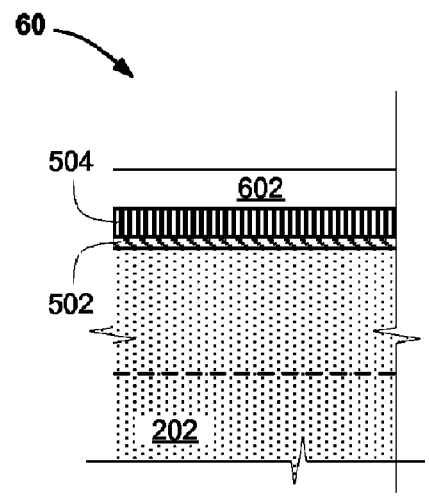

Referring to FIG. 1, in a stage 101a semiconductor substrate 202 is provided; typically the substrate is a single-crystal silicon substrate, but other semiconductors are contemplated. In a stage 103 a device implant is carried out in a memory array region 2100 and in a peripheral region 2200 of the semiconductor substrate (FIG. 3, at 30). First device implants may be performed at this stage: to form P or N wells for access devices in the memory array region, and P or N wells for peripheral logic devices in the peripheral region. One or more additional implants may be performed at this stage including: an implant to form bit lines in the memory array region (by, for example, a N+ implant where the well is P), and implants to form elements of diode access devices or transistor access devices (by, for example, a P implant over a N+ implant, to form a N-P diode; or a P implant over a N+ implant, followed by an additional shallow N+ implant). Or, one or more device implants may be performed at one or more subsequent stages.

The access devices in the memory array region 2100 are not shown in these FIGs. Suitable access devices include, for example, vertically-constructed devices, such as vertical diodes, vertical field effect transistors (FET), vertical bipolar junction transistors (BJT), vertical metal oxide semiconductors (MOS).

Subsequently, in a stage 104 a gate oxide layer 402 is formed over the substrate surface in both the memory array region 2100 and in a peripheral region 2200; and in a subsequent stage a gate layer 404 is formed over the gate oxide layer 402. A result is shown at 40 in FIG. 4. In later stages (outlined below), the gate oxide layer and the gate layer will be patterned to form gate structures in the peripheral logic. Suitable materials for the gate layer include polysilicon, for example, and the gate layer may be formed by low-pressure chemical-vapor deposition, for example.

In a subsequent stage 105 first trench isolations (parallel to the bit line direction) are formed in the memory array region (trench isolations 2117) and in the peripheral region (trench isolations 2217). A suitable technique for forming the trenches results in substantially planar, approximately vertical sidewalls, and may be carried out in two or more steps. Suitable techniques for forming the trench include, for example, a directional etch such as, for example, an RIE. The RIE may be controlled by selection of process parameters; employing lower pressure and higher substrate bias may provide better control of the shape and dimensions of the trench. Where RIE is employed, it may be followed by a cleaning process. A double-patterning or manifold patterning lithographic technique may be employed; examples of such techniques are outlined in Ping Xie et al. (2009) "Analysis of higher-order pitch division for sub-32 nm lithography", *Proc. of SPIE*, Vol. 7274, pp. 72741Y-1 through 72741Y-8. The isolation trenches in both the periphery region and the memory array region may be patterned using a common (shared) mask.

Suitable materials for filling the trenches are dielectric, and suitable dielectric materials include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric can be formed by, for example, a physical vapor deposition (PVD) process, or a chemical vapor deposition (CVD) process. A planarizing step (by, for example, a chemical mechanical polish, CMP) may be carried out following trench filling. A result is shown at 50 in FIGS. 5A, 5B.

In a subsequent stage 106 a silicon nitride layer 602 is formed over the structure resulting from trench isolation. Suitable techniques for forming the silicon nitride layer include low pressure chemical vapor deposition, for example. The silicon nitride is patterned in a subsequent step, and the patterned silicon nitride serves as a hard mask for trench formation (see below). Materials other than silicon nitride, suitable for use as a hard mask, may be used to form this layer. A result is shown at 60 in FIGS. 6A, 6B, 6C.

In a subsequent stage 107 second trenches (parallel to the word line direction) are formed in the memory array region, using a mask-and etch procedure to form patterned trenches through the SiN and through selected underlying layers. The mask for patterning the hard mask layer (silicon nitride) in this step is not shown in the FIGs. This constitutes a (first) critical mask step for the array; that is, the dimensions of this mask establish the array density and position. Suitable techniques for forming the second trenches include techniques that selectively remove the unmasked SiN 602, the unmasked gate material 504, the unmasked gate oxide material 502, and the unmasked semiconductor substrate 202 material; but do not remove the dielectric fill in the first trench isolations. The etch may be carried out in more than one step, using etch techniques and/or etch parameters suitable for the various materials being etched. Suitable techniques for forming the trench include, for example, a directional etch such as, for example an RIE. The RIE may be controlled by selection of process parameters; employing lower pressure and higher substrate bias may provide better control of the shape and dimensions of the trench. A double-patterning or manifold patterning lithographic technique may be employed; examples of such techniques are outlined in Ping Xie et al. (2009), cited above. The final stage of the etch may be timed, to establish an etch stop at the bottom of the trench. A result is shown at 70 in FIGS. 7A, 7B, 7C.

In a subsequent stage 108 a memory array device implantation may be carried out. As will be appreciated, the memory array implant must be carried out before formation of the silicon nitride mask.

In a subsequent stage 108' optionally a salicide 820 is formed on the memory array; and a dielectric fill 840 is formed. Suitable materials for filling the trenches are dielectric, and suitable dielectric materials include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric can be formed by, for example, a physical vapor deposition (PVD) process, or a chemical vapor deposition (CVD) process. A planarizing step (by, for example, a chemical mechanical polish, CMP) may be carried out following trench filling. A result is shown at 80 in FIGS. 8A, 8B, 8C.

The portion of the SiN layer 602 overlying the periphery region is removed, leaving in place strips 920 of the SiN layer overlying the access devices. In a subsequent stage 109 logic gates (e.g., 910, 910') are patterned (masked and etched) in the peripheral region. Each patterned gate (e.g., gate 910) includes a gate structure 911 stacked over a gate oxide 913. A result is shown at 90 in FIGS. 9A, 9B. Suitable materials for the logic gate mask and suitable techniques for etching, that remove unmasked gate material but do not remove the isolation structures, are known. The strips 920 of SiN remaining over the memory array region protect the gate and gate oxide that overlies the memory cell devices.

In a subsequent stage 110 a peripheral device implantation is carried out to form source and drain regions, and thereafter in the peripheral region dielectric spacers are formed adjacent the gate stacks (1001) and at exposed surfaces of the dielectric trench isolation structures (1002). Thereafter a salicide 1010 is formed on exposed areas of the substrate adjacent the spacers and on the exposed surfaces of the gates. A result is shown at 110 in FIGS. 10A, 10B.

In a subsequent stage 111 the peripheral region is filled with a dielectric 112 and the resulting structure is planarized, for example by CMP. Suitable materials for the dielectric include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric support layer can be formed by, for example, a physical vapor deposition (PVD) process, or a chemical vapor deposition (CVD) process. A result is shown at 110 in FIGS. 11A, 11B.

Figure 12C:
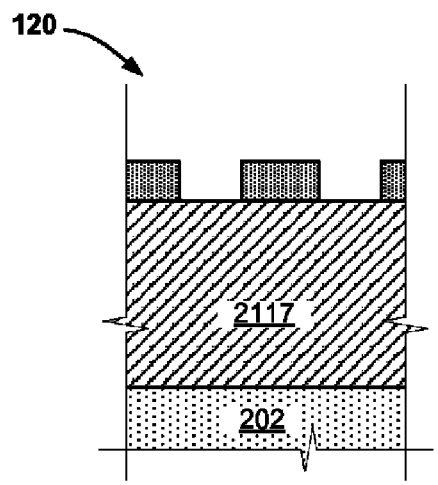
Figure 12D:
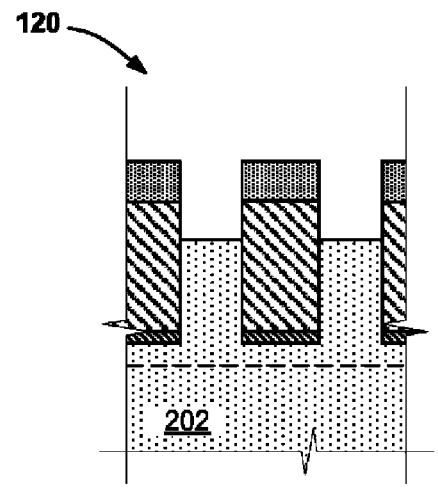
Figure 12A:
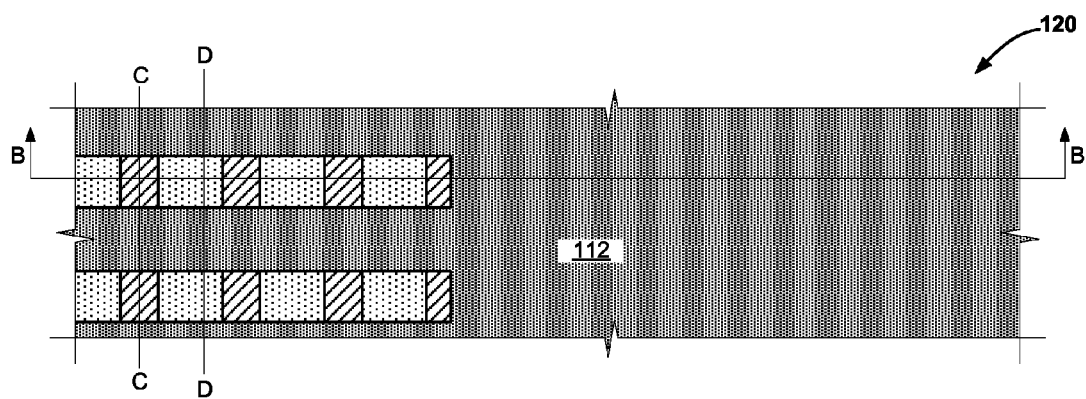
Figure 12B:
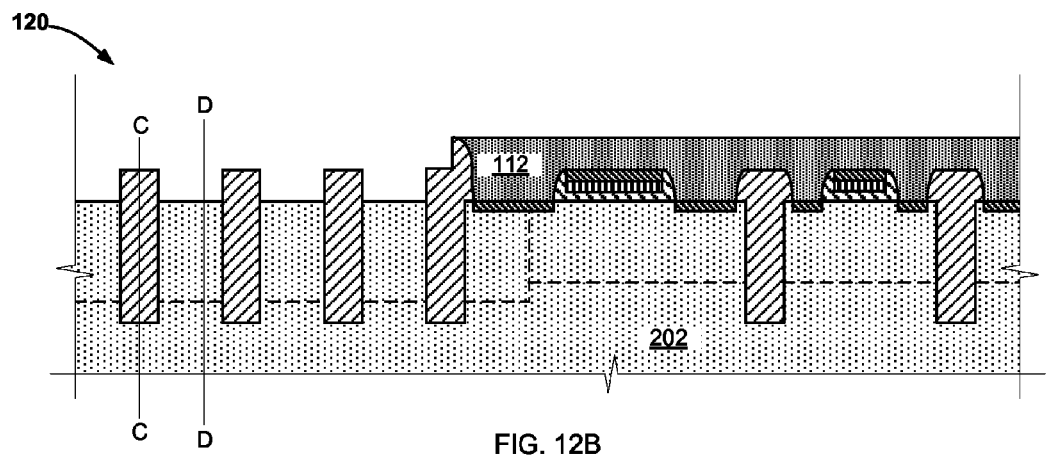
Figure 13A:
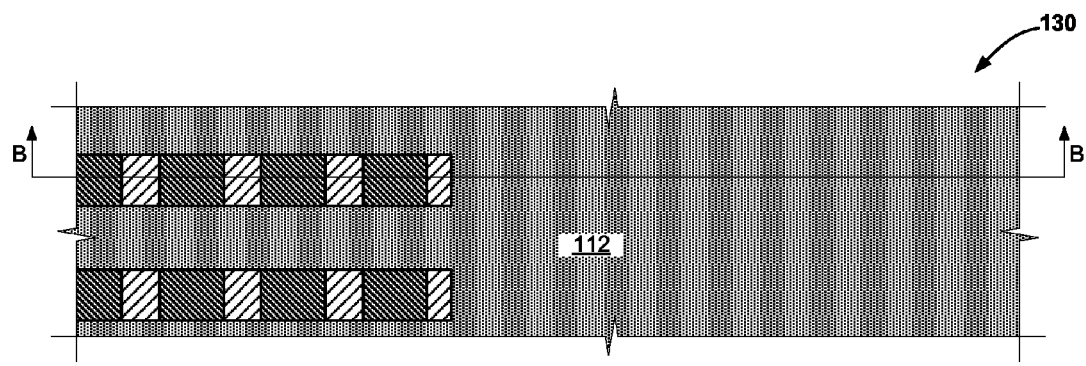
Figure 13B:
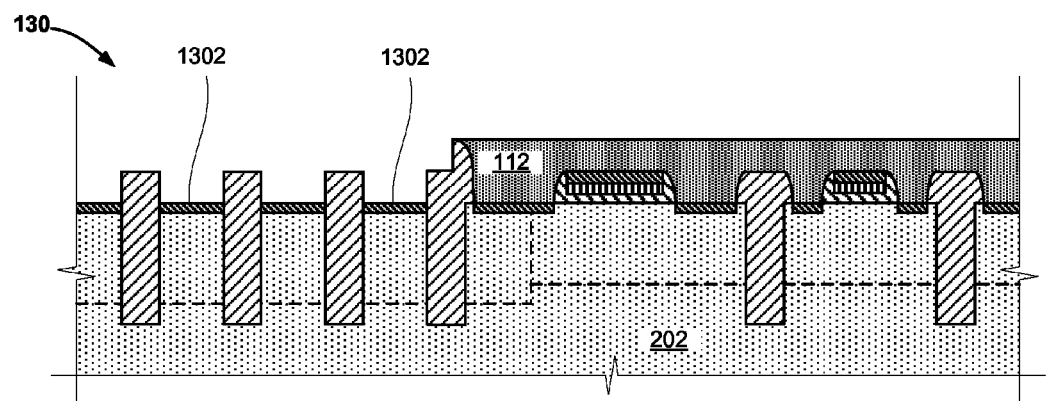
Figure 13C:
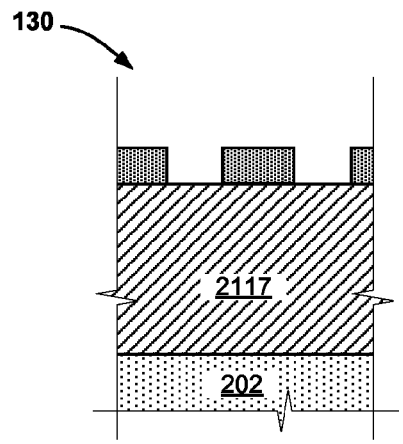
Figure 13D:
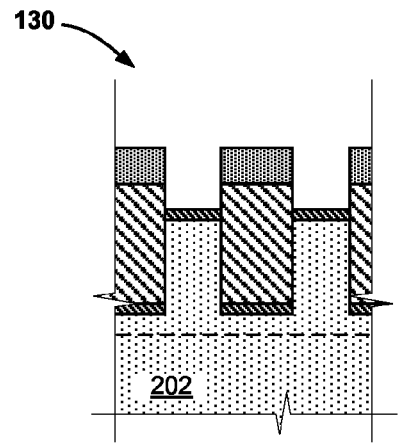
Figure 14C:
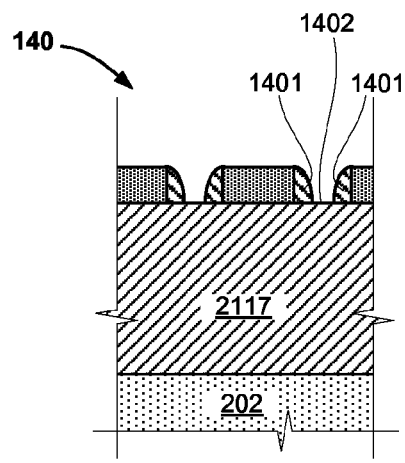
Figure 14D:
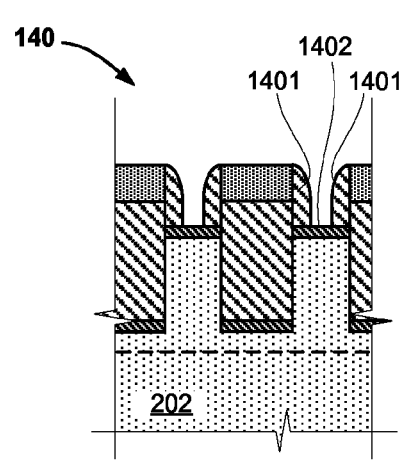
Figure 14A:
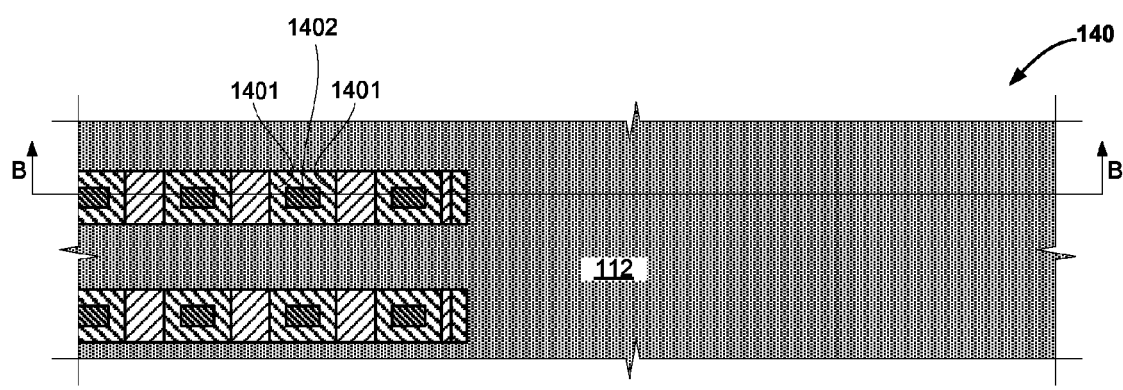
Figure 14B:
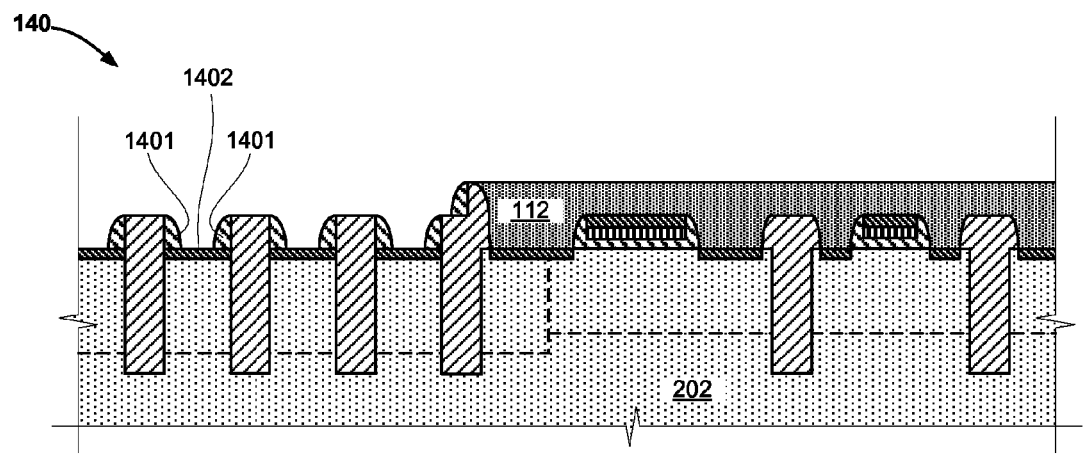
Figure 15A:
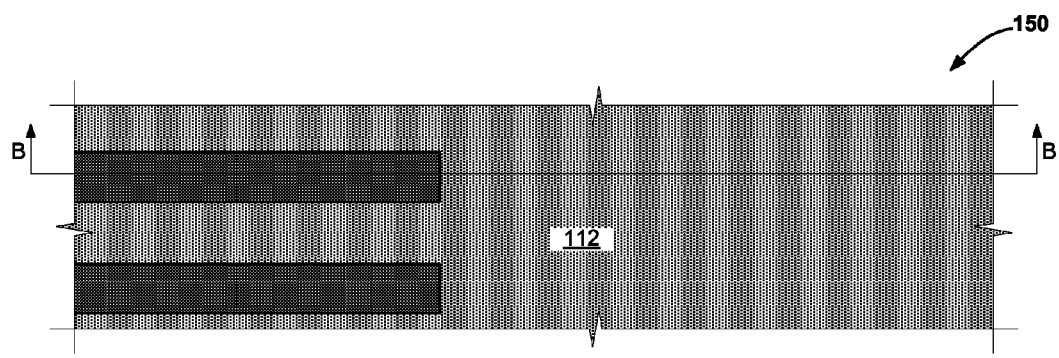
Figure 15B:
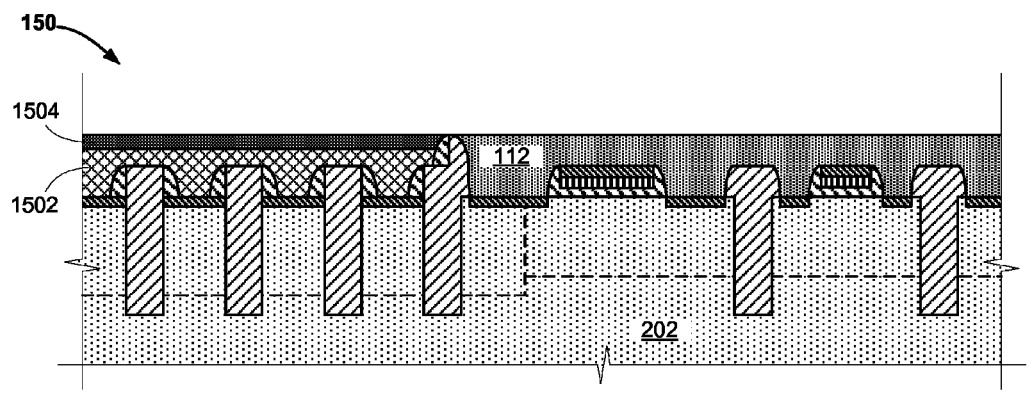
Figure 16A:
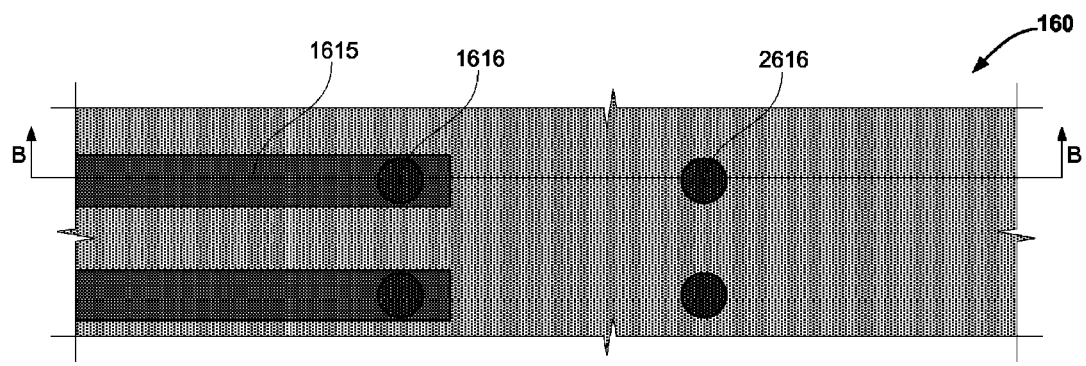
Figure 16B:
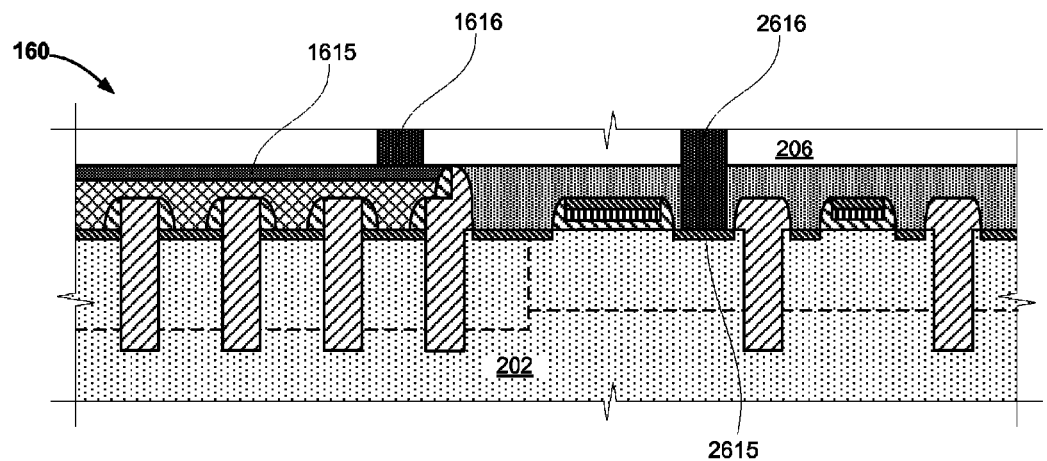

In a subsequent stage 112 the gate oxide layer and silicon oxide layer are removed from the memory array region, by for example a selective etch. A result is shown in FIGS. 12A, 12B. In a subsequent stage 113 optionally an additional memory array implant may be carried out, optionally followed by a salicide, e.g. salicide 1302. A result is shown at 130 in FIGS. 13A, 13B.

In a subsequent stage 114 oxide spacers are formed on oxide sidewalls in the memory array region, with a result as shown for example at 140 in FIGS. 14A, 14B, 14C, 14D. The oxide spacers (e.g., spacers 1401) obscure much of the salicide overlying the access devices in the memory array region, so that only a small contact area 1402 is left exposed. This small contact area is, as a result of the process, aligned ("self-aligned") with the underlying access device, and also will be aligned with the intersection of the word and bit lines, as described below.

In a subsequent stage 115 the phase change material 1502 is deposited over the memory array region, filling in the openings over the small contact areas of exposed salicide.

In the example shown, a chalcogenide material is employed. The chalcogenide material film may be formed by vapor deposition, such as physical vapor deposition (PVD) or chemical vapor deposition (CVD), for example.

An example of a method for forming a chalcogenide material film uses a PVD-sputtering or magnetron-sputtering method with source gas(es) of Ar, $N_2$, and/or He, etc. at the pressure in the range 1 mTorr~100 mTorr. The deposition is usually done at room temperature. A collimator with an aspect ratio of 1~5 can be used to improve the fill-in performance. To improve conformity with the surfaces, a DC bias of several tens of volts to several hundreds of volts may also be used. On the other hand, the combination of DC bias and the collimator can be used simultaneously.

Another example of a method for forming a chalcogenide material film uses CVD such as that disclosed in U.S. Patent Application Publication No. 2006/0172067, titled "Chemical Vapor Deposition of Chalcogenide Materials", which is incorporated by reference herein.

Thereafter a top electrode material 1504 is deposited in contact with the phase change material, and the structure is planarized, for example by CMP. A result is shown at 150 in FIGS. 15A, 15B. Suitable materials for the top electrode include conductive materials such as a metal or metal-based material or a non-metal material, such as, e.g.: copper; aluminum; titanium (Ti) and titanium-based materials such as titanium nitride (TiN), titanium ox nitride (TON); tantalum (Ta) and tantalum-based materials such as tantalum nitride (TaN); polysilicon, tungsten-based materials such as tungsten silicide ($WSi_x$); and, for a low thermal conductivity electrode, materials such as LNO ($LaNiO3$) and LSMO ($LaSrMnO_3$).

The top electrode layer may be formed by any of a variety of techniques suited to the particular material. Such techniques include, by way of example, sputtering and plating and CVD. The top electrode may have a thickness, for example, in a range about 200 Å to about 5000 Å, usually about 2000 Å.

A post-deposition annealing treatment in a vacuum or in an $N_2$ ambient is optionally performed to improve the crystalline state of chalcogenide material. The annealing temperature typically ranges from 100° C. to 400° C. with an anneal time of less than 30 minutes.

In a subsequent stage 116 a dielectric coating, for example of borophosphosilicate glass (BPSG) is formed over the structure, and the BPSG is planarized. Then contacts are formed to couple structures in the memory array and in the periphery to the top surface of the structure. Contact 2616 is coupled to doped region 2615 and extends to the top surface of dielectric 206 where it can access overlying circuitry. Contact 1616 is coupled to top electrode 1615 and extends to the top surface of dielectric 206 where it can access overlying circuitry.

Figure 17:
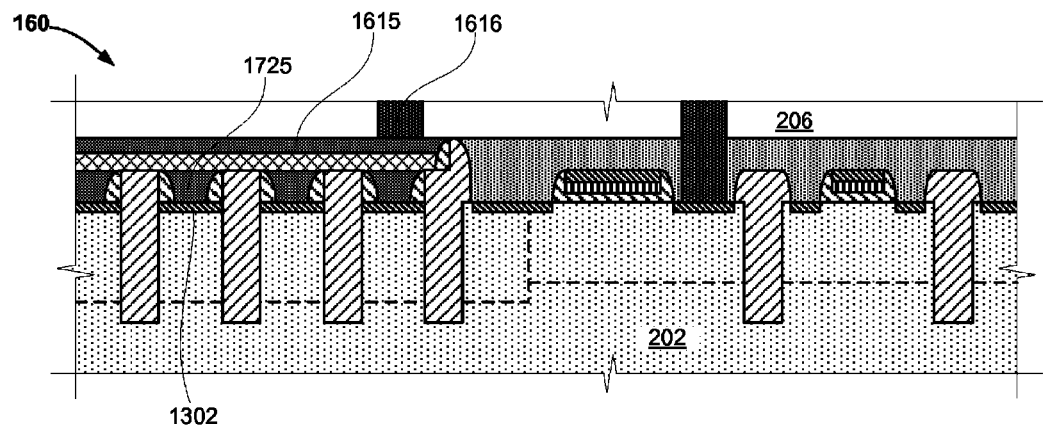

As noted above, other phase change memory array constructs are contemplated. For example, a lower electrode material may be deposited in the narrowed openings formed by the dielectric spacers over the contact layer; and a phase change material may be deposited over the lower electrode material. Such a configuration is illustrated in FIG. 17, for example. Here the lower electrode material 1725 contacts the narrowed surface of the salicide 1302.

FIG. 18 is a flow diagram outlining stages in a process for making a phase change memory according to another embodiment; and FIGS. 19A-28B illustrate, in various views, stages in construction of a phase change memory according to another embodiment of the invention. In the embodiment illustrated here, the phase change memory element is self-aligned only to the bit line.

Referring to FIG. 18, stages are similar to earlier stages of the process outlined with reference to FIG. 1; and reference is made to earlier FIGs. in the discussion following. In this embodiment, as in the embodiment illustrated in FIG. 1, a common mask may be employed for forming the first trench isolations (parallel to the bit line direction) in both the memory array region and the peripheral region. However, unlike the embodiment illustrated in FIG. 1, in this embodiment no silicon nitride hard mask is employed, and two different masks are employed to form second trench isolations and structures parallel to the word line direction in the memory array region. Accordingly, in this embodiment the bit lines are self-aligned with at least the access devices and the bottom electrodes; but the word line is not self-aligned.

Particularly, in a stage 1801 a semiconductor substrate 202 is provided; typically the substrate is a single-crystal silicon substrate, but other semiconductors are contemplated. In a stage 1803 a device implant is carried out in a memory array region 2100 and in a peripheral region 2200 of the semiconductor substrate (FIG. 3, at 30). First device implants may be performed at this stage: to form P or N wells for access devices in the memory array region, and P or N wells for peripheral logic devices in the peripheral region. One or more additional implants may be performed at this stage including: an implant to form bit lines in the memory array region (by, for example, a N+ implant where the well is P), and implants to form elements of diode access devices or transistor access devices (by, for example, a P implant over a N+ implant, to form a N-P diode; or a P implant over a N+ implant, followed by an additional shallow N+ implant). Or, one or more device implants may be performed at one or more subsequent stages. The access devices in the memory array region 2100 are not shown in these FIGs. Suitable access devices include, for example, vertically-constructed devices, such as vertical diodes, vertical field effect transistors (FET), vertical bipolar junction transistors (BJT), vertical metal oxide semiconductors (MOS).

Subsequently, in a stage 1804 a gate oxide layer 402 is formed over the substrate surface in both the memory array region 2100 and in a peripheral region 2200; and in a subsequent stage a gate layer 404 is formed over the gate oxide layer 402. A result is shown at 40 in FIG. 4. In later stages (outlined below), the gate oxide layer and the gate layer will be patterned to form gate structures in the peripheral logic. Suitable materials for the gate layer include polysilicon, for example, and the gate layer may be formed by low pressure chemical-vapor deposition, for example.

In a subsequent stage 1805 first trench isolations (parallel to the bit line direction) are formed in the memory array region (trench isolations 2117) and in the peripheral region (trench isolations 2217). A suitable technique for forming the trenches results in substantially planar, approximately vertical sidewalls, and may be carried out in two or more steps. Suitable techniques for forming the trenches include, for example, a directional etch such as, for example, an RIE. The RIE may be controlled by selection of process parameters; employing lower pressure and higher substrate bias may provide better control of the shape and dimensions of the trench. Where RIE is employed, it may be followed by a cleaning process. A double-patterning or manifold patterning lithographic technique may be employed; examples of such techniques are outlined in Ping Xie et al. (2009), cited above. The isolation trenches in both the periphery region and the memory array region may be patterned using a common (shared) mask.

Suitable materials for filling the trenches are dielectric, and suitable dielectric materials include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric can be formed by, for example, a physical vapor deposition (PVD) process, or a chemical vapor deposition (CVD) process. A planarizing step (by, for example, a chemical mechanical polish, CMP) may be carried out following trench filling. A result is shown at 50 in FIGS. 5A, 5B.

In a subsequent stage 1807 second trenches (parallel to the word line direction) are formed in the memory array region, using a mask-and etch procedure to form patterned trenches through the SiN and through selected underlying layers. Preferred first critical mask materials include a photoresist. The mask for patterning the hard mask layer (silicon nitride) in this step is not shown in the FIGs. This constitutes a (first) critical mask step for the array; that is, the dimensions of this mask establish the array density and position. Suitable techniques for forming the second trenches include techniques that selectively remove the unmasked SiN 602, the unmasked gate material 504, the unmasked gate oxide material 502, and the unmasked semiconductor substrate 202 material; but do not remove the dielectric fill in the first trench isolations. The etch may be carried out in more than one step, using etch techniques and/or etch parameters suitable for the various materials being etched. Suitable techniques for forming the trench include, for example, a directional etch such as, for example an RIE. The RIE may be controlled by selection of process parameters; employing lower pressure and higher substrate bias may provide better control of the shape and dimensions of the trench. A double-patterning or manifold patterning lithographic technique may be employed;

examples of such techniques are outlined in Ping Xie et al. (2009), cited above. The final stage of the etch may be timed, to establish an etch stop at the bottom of the trench.

Thereafter a memory array device implantation 1808 is carried out. Optionally thereafter in a procedure 1808' a salicide 1920 is formed over the memory array, and a dielectric fill 1940 is formed. Suitable materials for filling the trenches are dielectric, and suitable dielectric materials include, for example, oxides (e.g., silicon oxides, such as $SiO_2$) and nitrides (e.g., silicon nitrides, such as SiN); low-K dielectric materials (such as a doped $SiO_2$, for example) may be preferred; and materials having low thermal conductivity may be preferred. The dielectric can be formed by, for example, a physical vapor deposition (PVD) process, or a chemical vapor deposition (CVD) process. A planarizing step (by, for example, a chemical mechanical polish, CMP) may be carried out following trench filling. A result is shown at 190 in FIGS. 19A, 19B, 19C.

In a subsequent stage 1809 logic gates (e.g., 2010, 2010') are patterned (masked and etched) in the peripheral region. Each patterned gate (e.g., gate 2010) includes a gate structure 2011 stacked over a gate oxide 2013. A result is shown at 200 in FIGS. 20A, 20B. Suitable materials for the logic gate mask include a photoresist; suitable techniques for etching include techniques that remove unmasked gate material but do not remove the isolation structures.

In a subsequent stage 1810 a peripheral device implantation is carried out to form source and drain regions, and thereafter in the peripheral region dielectric spacers are formed adjacent the gate stacks (2010) and at exposed surfaces of the dielectric trench isolation structures (2012). A result is shown at 210 in FIGS. 21A, 21B.

Figure 22A:
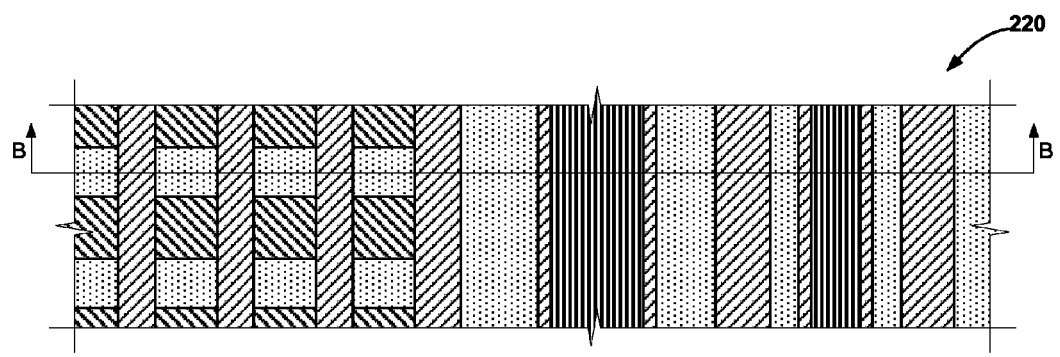
Figure 22B:
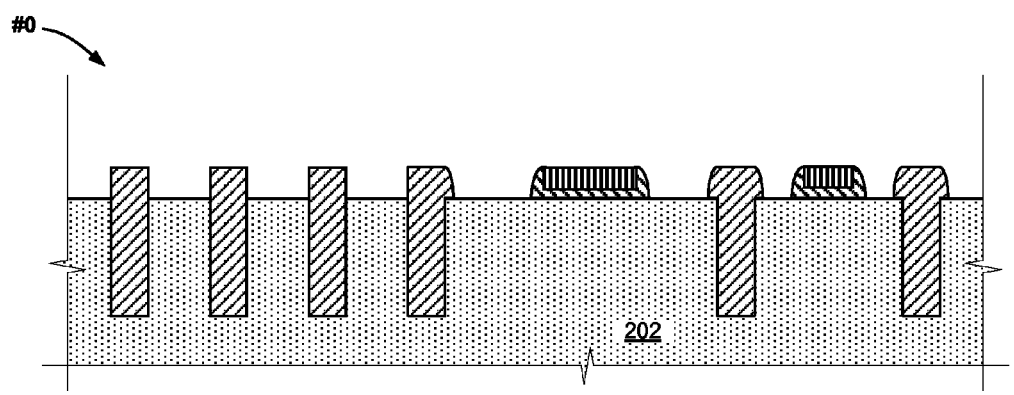
Figure 23A:
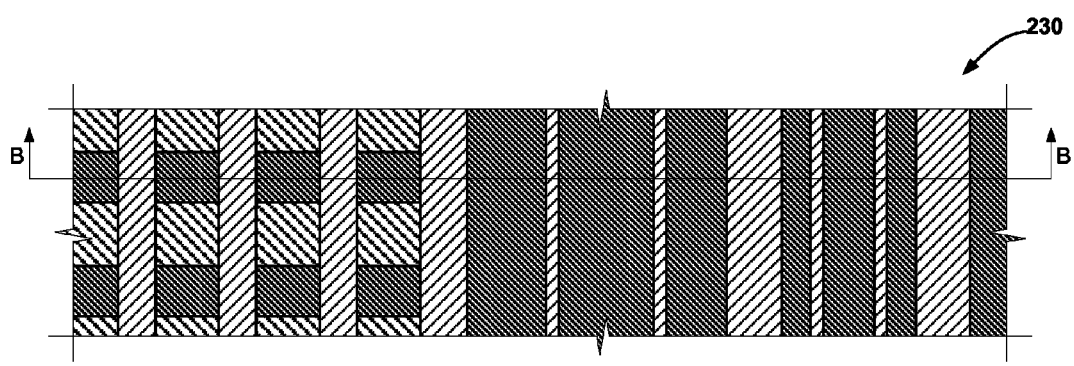
Figure 23B:
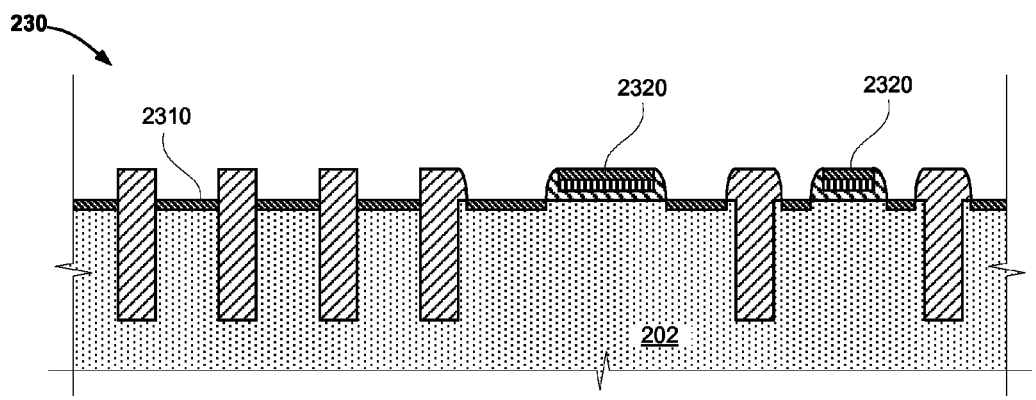

In a subsequent stage 1812 the gate oxide layer and the silicon nitride are removed from the memory array region. A result is shown in FIGS. 22A, 22B.

In a subsequent stage 1813 optionally an additional array device implant is carried out, followed by formation of a salicide 2310, 2320 over the peripheral region and the memory array region. A result is shown at 230 in FIGS. 23A, 23B.

Figure 24A:
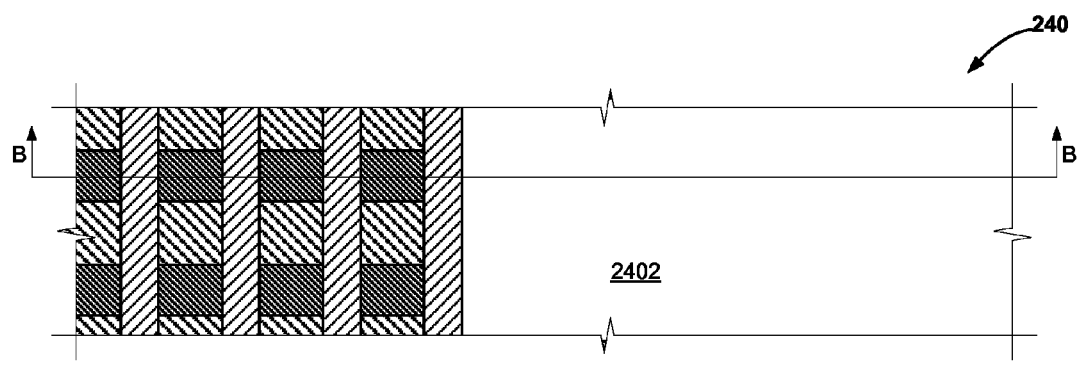
Figure 24B:
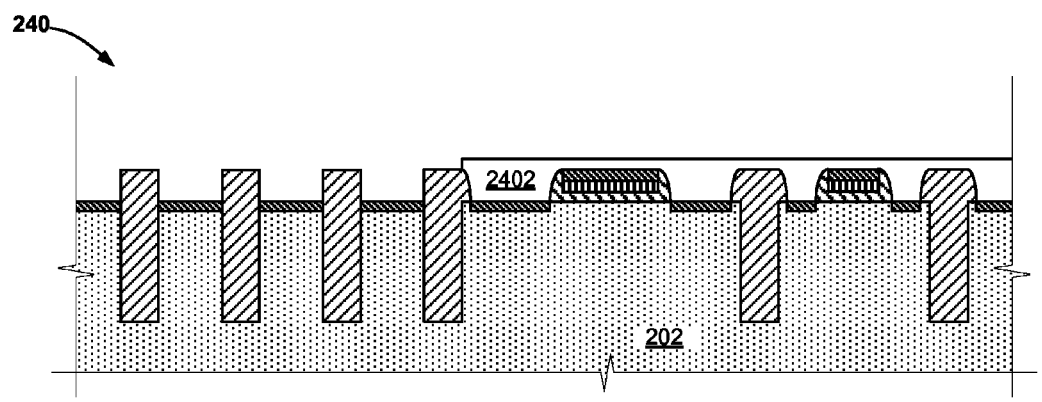

In a subsequent stage 1814 the peripheral region is protected by a mask 2402; a result is shown at 240 in FIGS. 24A, 24B.

Figure 25A:
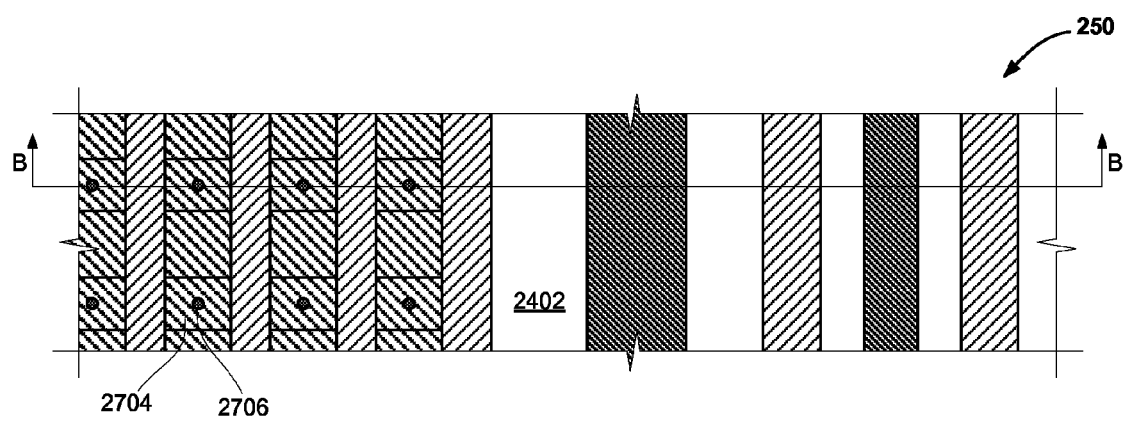
Figure 25B:
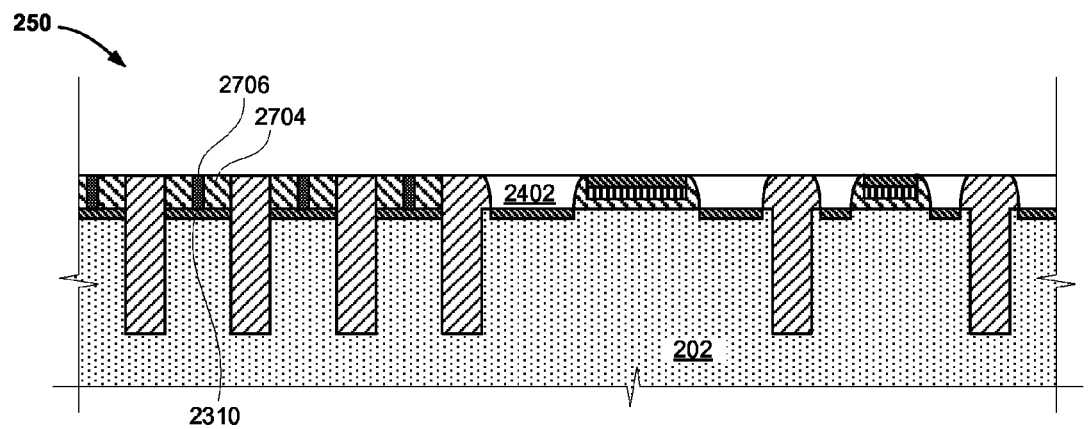
Figure 26A:
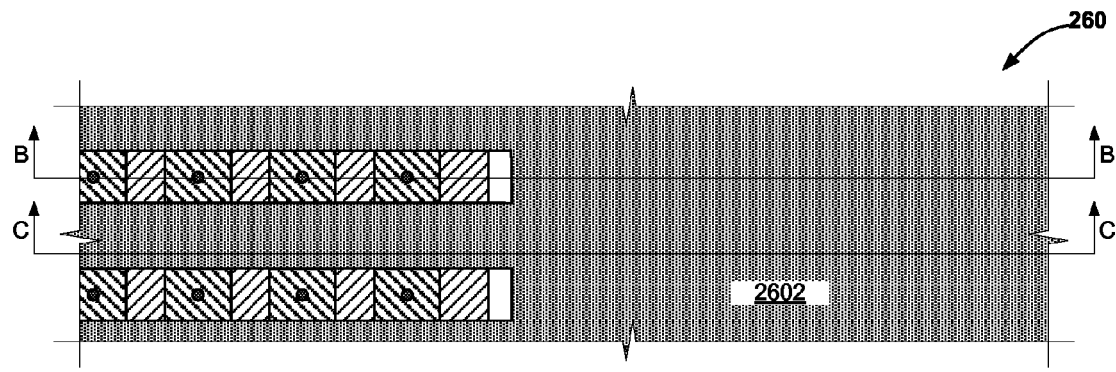
Figure 26B:
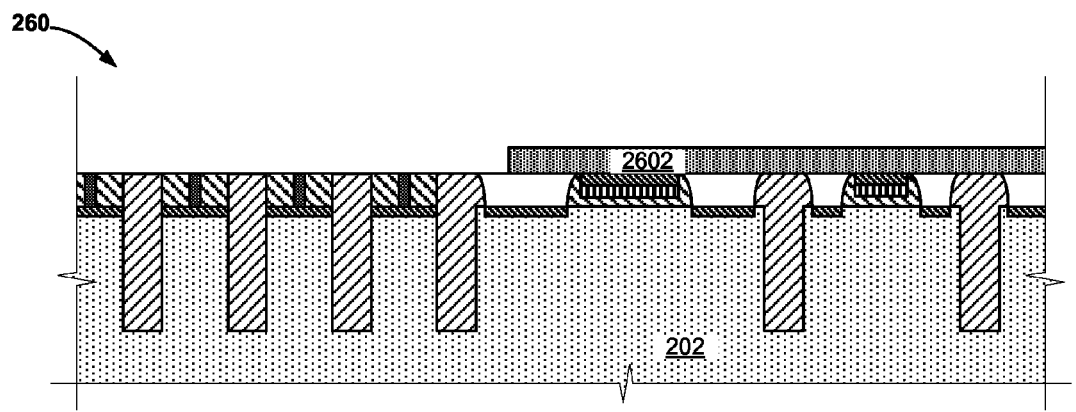
Figure 26C:
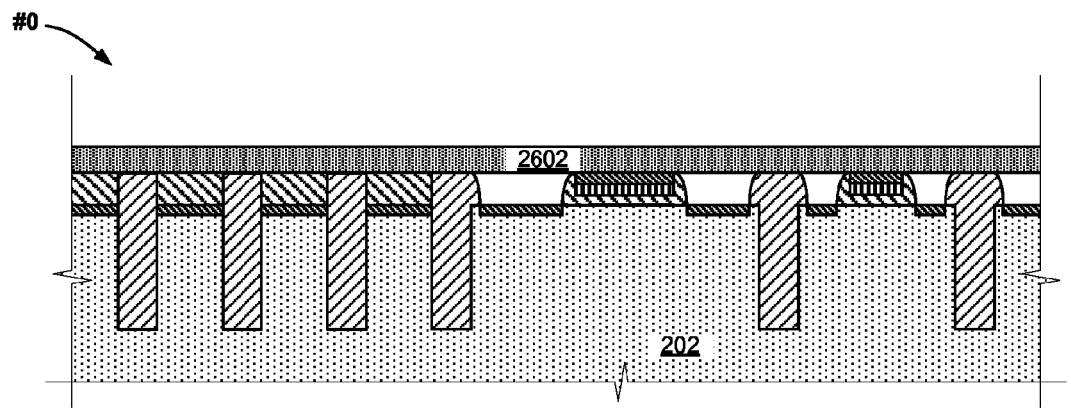
Figure 27A:
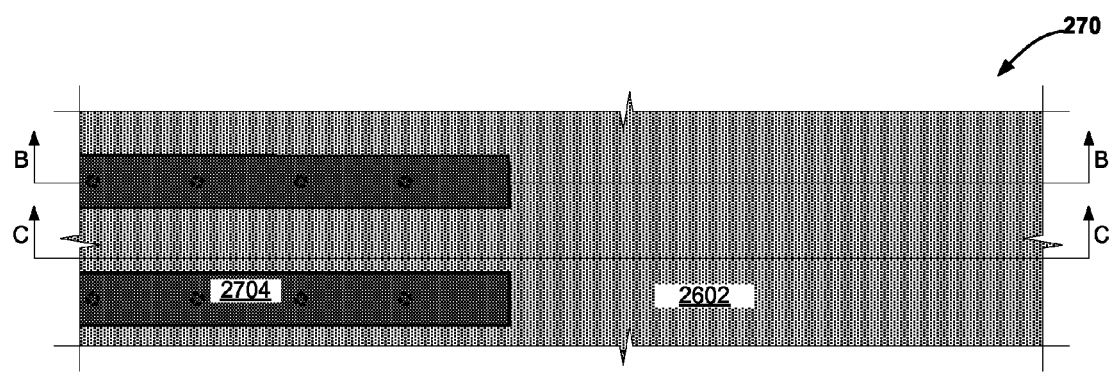
Figure 27B:
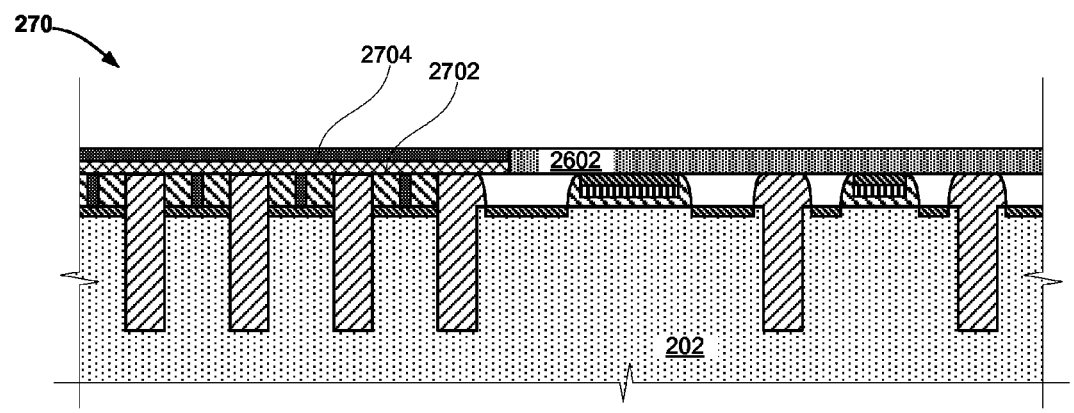
Figure 28A:
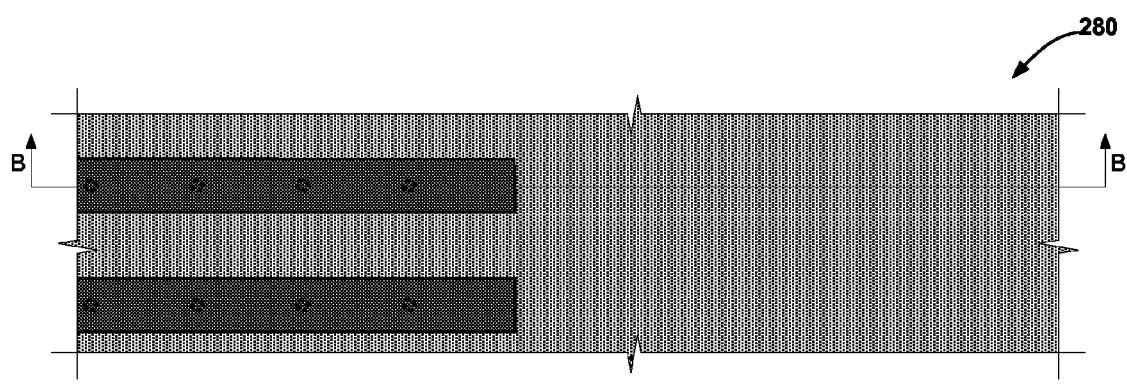
Figure 28B:
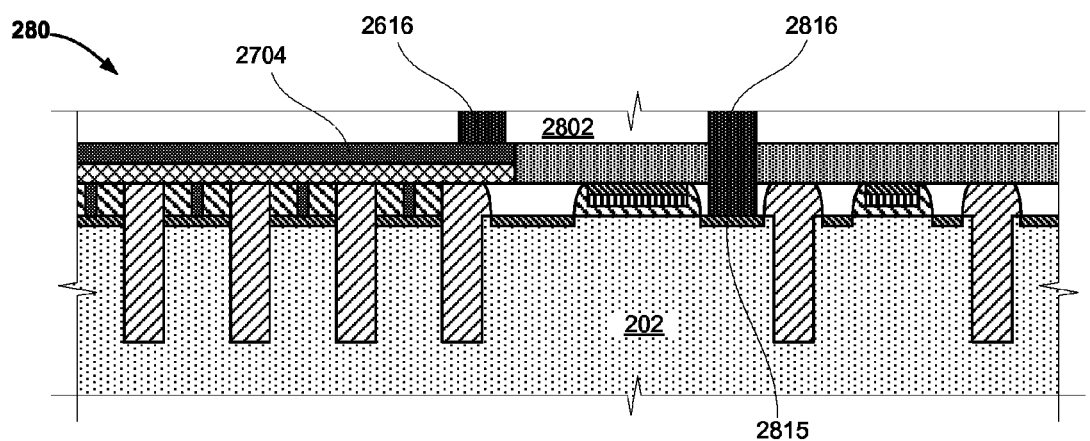

In a subsequent stage 1815 spacers are formed over the memory array region, to reduce the size of the exposed areas of the salicides 2310 overlying the access devices, so that only a small contact area is left exposed. A result is shown in FIGS. 25A, 25B. The spacers may be formed by, for example, depositing a layer of dielectric material over the surface and then employing an anisotropic etch to form pores to expose small areas of the underlying salicide for contact. This small contact area is, as a result of the process, aligned ("self-aligned") with the underlying access device, and also will be aligned with the intersection of the word and bit lines, as described below.

This is followed by filling the pores or narrowed openings with a bottom electrode material 2706 such as, for example, TiN and then planarizing. A result is shown at 250 in FIGS. 25A, 25B.

In a subsequent stage 1816 a word line dielectric layer 2602 is formed over the planarized surface resulting from the stage 1815, and in a stage 1817 word line trenches are formed through the word line dielectric in a second critical mask step. A result is shown at 260 in FIGS. 26A, 26B, 26C.

Thereafter a phase change material 2702 is deposited into the word line trenches, in contact with the bottom electrodes, and a top electrode material 2704 is deposited over and in contact with the phase change material 2702. The resulting structure is planarized. A result is shown at 270 in FIGS. 27A, 27B.

In a subsequent stage 1819 a dielectric coating 2802, for example of borophosphosilicate glass (BPSG) is formed over the structure, and the BPSG is planarized. Then contacts are formed to couple structures in the memory array and in the periphery to the top surface of the structure. Contact 2816 is coupled to doped region 2815 and extends to the top surface of dielectric 2802 where it can access overlying circuitry. Contact 2616 is coupled to top electrode 2704 and extends to the top surface of dielectric 206 where it can access overlying circuitry.

As noted above, other phase change memory array constructs are contemplated. For example, FIG. 29 shows a construct having a pore structure, in which a plug of phase change material 2910 in the pore contacts the salicide beneath and contacts an overlying strip of phase change material 2902, which is turn is overlain by an electrode 2904. A contact 2916 is coupled to the top electrode 2904 and extends to the top surface of dielectric 2922 where it can access overlying circuitry. And, for example, FIG. 30 shows a construct having a pore structure, in which a plug of phase change material 3010 in the pore contacts the salicide beneath and contacts an overlying electrode 3004. A contact 3016 is coupled to the top electrode 3004 and extends to the top surface of dielectric 3022 where it can access overlying circuitry.

Other embodiments are within the claims.

We claim:

1. A programmable memory device, comprising
a semiconductor substrate body having a substrate surface including a periphery region and a memory array region,
a plurality of trench isolation structures in the substrate body in both the periphery region and the memory array region, each trench isolation structure extending into the substrate body, and having a top surface that is above the substrate surface, so that inter-trench regions bounded by a plane level with the top surfaces of adjacent trench isolations structures, by sides of adjacent trench isolation structures and by the substrate surface are defined in both the periphery region and the memory array region,
a programmable memory array in the memory array region and transistors at the substrate surface in the periphery region, the transistors at the substrate surface including gates inside the inter-trench regions,
the memory array region having insulating material with pores in the inter-trench regions, the memory array comprising access devices in the substrate body and programmable memory elements over the substrate surface, wherein the access devices and memory elements are aligned at cross-points of bit lines and word lines, and at least one of a electrode element connecting the memory element with a corresponding access device, and at least a part of the memory element fill said each of said pores.

2. The programmable memory device of claim 1 wherein the word lines are self-aligned with the programmable memory elements and the access devices.

3. The programmable memory device of claim 1 wherein memory cells in the memory array have an area equal to $4D^2$, where D is about one half the sum of the word line width and the separation distance between word lines.

4. The programmable memory device of claim 1 wherein memory cells in the memory array have an area equal to $4D^2$, where D is about the nominal feature size for a lithographic process used in manufacturing the memory cells.

5. The programmable memory device of claim 1, wherein the electrode element connecting the memory element with a corresponding access device fill said each of said pores.

6. The programmable memory device of claim 1, wherein at least a portion of the memory element fill said each of said pores.

* * * * *